US011948508B2

(12) United States Patent
Toyomura

(10) Patent No.: US 11,948,508 B2
(45) Date of Patent: Apr. 2, 2024

(54) DISPLAY DEVICE, DRIVING METHOD FOR DISPLAY DEVICE, AND ELECTRONIC EQUIPMENT

(71) Applicant: Sony Semiconductor Solutions Corporation, Kanagawa (JP)

(72) Inventor: Naobumi Toyomura, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/765,649

(22) PCT Filed: Jul. 21, 2020

(86) PCT No.: PCT/JP2020/028227
§ 371 (c)(1),
(2) Date: Mar. 31, 2022

(87) PCT Pub. No.: WO2021/090536
PCT Pub. Date: May 14, 2021

(65) Prior Publication Data
US 2022/0383815 A1   Dec. 1, 2022

(30) Foreign Application Priority Data

Nov. 5, 2019 (JP) ................................. 2019-200743

(51) Int. Cl.
*G09G 3/32* (2016.01)
*G09G 3/3233* (2016.01)

(52) U.S. Cl.
CPC ... *G09G 3/3233* (2013.01); *G09G 2300/0452* (2013.01); *G09G 2300/0852* (2013.01);
(Continued)

(58) Field of Classification Search
CPC ......... G09G 3/30–3291; G09G 3/3233; G09G 2300/0452; G09G 2300/085
See application file for complete search history.

(56) References Cited

U.S. PATENT DOCUMENTS

2012/0105749 A1   5/2012  Tseng et al.
2014/0027719 A1*  1/2014  Kim ..................... G09G 3/3241
                                                           257/40
(Continued)

FOREIGN PATENT DOCUMENTS

JP   2006243174 A   9/2006
JP   2006243175 A   9/2006
(Continued)

OTHER PUBLICATIONS

International Search Report (PCT/ISA/210), International Application No. PCT/JP2020/028227, dated Sep. 8, 2020.

*Primary Examiner* — Roy P Rabindranath
(74) *Attorney, Agent, or Firm* — Michael Best & Friedrich LLP

(57) ABSTRACT

There is provided a display device in which display elements included in pixels are arrayed in a row direction and a column direction in a two-dimensional matrix, in which each of the display elements includes a current-driven light emitting unit and a drive circuit for driving the light emitting unit, the drive circuit includes at least a drive transistor and a capacitor, the drive transistor has one source/drain region to which a drive voltage is applied via a first feeder line and the other source/drain region connected to one end of the light emitting unit, and is configured in such a manner that a current corresponding to a voltage held in the capacitor flows to the light emitting unit via the drive transistor, and the drive voltage is applied to the one source/drain region of the drive transistor after a voltage of the other source/drain region of the drive transistor is set in such a manner that a difference between the voltage of the other source/drain region of the drive transistor and the drive voltage is decreased.

13 Claims, 26 Drawing Sheets

(52) U.S. Cl.
 CPC .............. *G09G 2320/0233* (2013.01); *G09G 2330/021* (2013.01); *G09G 2330/04* (2013.01)

(56) References Cited

U.S. PATENT DOCUMENTS

| | | | |
|---|---|---|---|
| 2021/0272499 A1* | 9/2021 | Shen | ............... G09G 3/3291 |
| 2022/0036824 A1* | 2/2022 | Lee | ............... G09G 3/3233 |

FOREIGN PATENT DOCUMENTS

| | | | |
|---|---|---|---|
| JP | 2014145851 A | 8/2014 | |
| JP | 2015187672 A | 10/2015 | |

\* cited by examiner

DISPLAY DEVICE, DRIVING METHOD FOR DISPLAY DEVICE, AND ELECTRONIC EQUIPMENT

FIELD

The present disclosure relates to a display device, a driving method for the display device, and electronic equipment.

BACKGROUND

A display element including a current-driven light emitting unit, and a display device including the display element are well known. For example, a display element including a light emitting unit having an organic electroluminescence element (hereinafter, also simply abbreviated as [organic EL light emitting unit]) has attracted attention as a display element capable of high-luminance light emission by low-voltage DC drive.

A display device including the display element having the organic EL light emitting unit is a self-luminous type, and further has sufficient responsiveness to a high-definition high-speed video signal. In a display device to be mounted on eyewear such as glasses or goggles, it is also required to set a pixel size to about several micrometers to 10 micrometers, for example.

Also, in the display device including the display element having the organic EL light emitting unit (hereinafter, also simply abbreviated as [display device]), a simple matrix and an active matrix are well known as drive systems. The active matrix has an advantage that luminance of an image can be increased although there is a disadvantage that a structure becomes complicated. A display element driven by the active matrix includes a drive circuit to drive the organic EL light emitting unit in addition to the organic EL light emitting unit having an organic layer including a light emitting layer, and the like. As the circuit to drive the organic EL light emitting unit, a drive circuit including a transistor and a capacitor are well known (see, for example, Patent Literature 1).

CITATION LIST

Patent Literature

Patent Literature 1: JP 2015-187672 A

SUMMARY

Technical Problem

Voltage is supplied to a display element in activation of a display device, and the state is maintained during operation. However, there may be a case where a high voltage exceeding a design value is instantaneously supplied to the display element at the time of activation or during operation of the display device. Application of the voltage exceeding the design value to the display element causes an overvoltage breakdown of a transistor used for the display element.

Thus, an object of the present disclosure is to provide a display device capable of preventing the overvoltage breakdown of the transistor used for the display element, a driving method for the display device, and electronic equipment including the display device.

Solution to Problem

A display device according to the present disclosure for achieving the above objective is provided in which display elements included in pixels are arrayed in a row direction and a column direction in a two-dimensional matrix, wherein each of the display elements includes a current-driven light emitting unit and a drive circuit for driving the light emitting unit, the drive circuit includes at least a drive transistor and a capacitor, the drive transistor has one source/drain region to which a drive voltage is applied via a first feeder line and other source/drain region connected to one end of the light emitting unit, and is configured in such a manner that a current corresponding to a voltage held in the capacitor flows to the light emitting unit via the drive transistor, and the drive voltage is applied to the one source/drain region of the drive transistor after a voltage of the other source/drain region of the drive transistor is set in such a manner that a difference between the voltage of the other source/drain region of the drive transistor and the drive voltage is decreased.

A driving method for a display device according to the present disclosure for achieving the above objective is provided in which display elements included in pixels are arrayed in a row direction and a column direction in a two-dimensional matrix, wherein each of the display elements includes a current-driven light emitting unit and a drive circuit for driving the light emitting unit, the drive circuit includes at least a drive transistor and a capacitor, and the drive transistor has one source/drain region to which a drive voltage is applied via a first feeder line and other source/drain region connected to one end of the light emitting unit, and is configured in such a manner that a current corresponding to a voltage held in the capacitor flows to the light emitting unit via the drive transistor, the driving method including: a step of setting a voltage of the other source/drain region of the drive transistor in such a manner that a difference between the voltage of the other source/drain region of the drive transistor and the drive voltage is decreased; and a step of applying the drive voltage to the one source/drain region of the drive transistor thereafter, the steps being performed by utilization of the display device.

Electronic equipment according to the present disclosure for achieving the above objective includes: a display device in which display elements included in pixels are arrayed in a row direction and a column direction in a two-dimensional matrix, wherein each of the display elements includes a current-driven light emitting unit and a drive circuit for driving the light emitting unit, the drive circuit includes at least a drive transistor and a capacitor, the drive transistor has one source/drain region to which a drive voltage is applied via a first feeder line and other source/drain region connected to one end of the light emitting unit, and is configured in such a manner that a current corresponding to a voltage held in the capacitor flows to the light emitting unit via the drive transistor, and the drive voltage is applied to the one source/drain region of the drive transistor after a voltage of the other source/drain region of the drive transistor is set in such a manner that a difference between the voltage of the other source/drain region of the drive transistor and the drive voltage is decreased.

DESCRIPTION OF EMBODIMENTS

Figure 1:
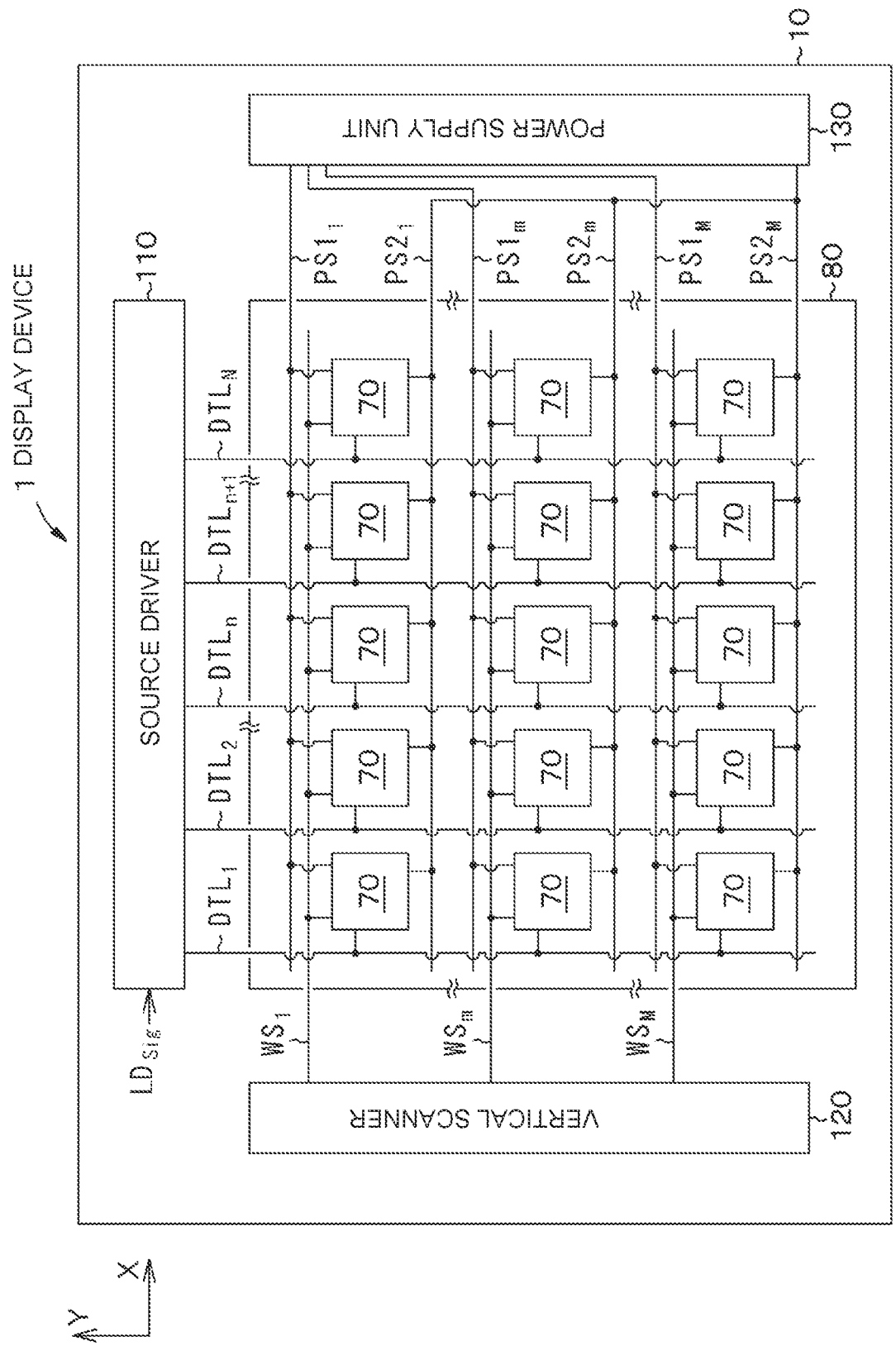
FIG. 1 is a conceptual diagram of a display device according to a first embodiment.

In the following, the present disclosure will be described on the basis of embodiments with reference to the drawings. The present disclosure is not limited to the embodiments, and various numerical values and materials in the embodiments are examples. In the following description, the same reference signs will be used for the same elements or elements having the same functions, and overlapped description will be omitted. Note that the description will be given in the following order.
1. General description related to a display device, a driving method for the display device, and electronic equipment according to the present disclosure
2. First embodiment
3. Modification example of the first embodiment
4. Second embodiment
5. Another configuration example of a display element
6. Description of electronic equipment, and others

[General Description Related to a Display Device, a Driving Method for the Display Device, and Electronic Equipment According to the Present Disclosure]

In the following description, a display device according to the present disclosure, a display device used in a driving method for the display device according to the present disclosure, and a display device included in electronic equipment according to the present disclosure may be simply referred to as a [display device of the present disclosure].

As described above, the display device of the present disclosure is a display device in which display elements included in pixels are arrayed in a row direction and a column direction in a two-dimensional matrix, in which
each of the display elements includes a current-driven light emitting unit and a drive circuit to drive the light emitting unit,
the drive circuit includes at least a drive transistor and a capacitor, and
the drive transistor has one source/drain region to which a drive voltage is applied via a first feeder line and the other source/drain region connected to one end of the light emitting unit, and is configured in such a manner that a current corresponding to a voltage held in the capacitor flows to the light emitting unit via the drive transistor.

Then, in the display device of the present disclosure, after a voltage of the other source/drain region of the drive transistor is set in such a manner that a difference between the voltage of the other source/drain region of the drive transistor and the drive voltage is decreased, the drive voltage is applied to the one source/drain region of the drive transistor.

Furthermore, in the driving method for the display device according to the present disclosure, a step of setting the voltage of the other source/drain region of the drive transistor in such a manner that the difference between the voltage of the other source/drain region of the drive transistor and the drive voltage is decreased, and a step of applying the drive voltage to the one source/drain region of the drive transistor thereafter are performed.

In the display device of the present disclosure, the voltage of the other source/drain region of the drive transistor can be set by a voltage setting circuit connected to the other source/drain region of the drive transistor.

In this case, the voltage setting circuit includes a diode-connected transistor, and
one end of the diode-connected transistor is connected to the other source/drain region of the drive transistor, and
the voltage of the other source/drain region of the drive transistor is set by application of voltage to the other end of the diode-connected transistor.

In this case, the other end of the diode-connected transistor is connected to a second feeder line, and
a voltage than a voltage during normal operation is supplied to the second feeder line. Then, the other end of the light emitting unit may be connected to a common feeder line independent of the second feeder line. Furthermore, the other end of the light emitting unit may be connected to the second feeder line.

Alternatively, the voltage setting circuit may include a switching transistor connected to the other source/drain region of the drive transistor, and
a voltage for setting may be applied to the other source/drain region of the drive transistor via the switching transistor brought into a conductive state.

Alternatively, in the display device of the present disclosure,
the other end of the light emitting unit may be connected to the second feeder line, and
the voltage of the other source/drain region of the drive transistor may be set when a voltage higher than the voltage during the normal operation is supplied to the second feeder line.

In the display device of the present disclosure including the above-described various preferable configurations, a voltage corresponding to a threshold voltage of the light emitting unit can be set as the voltage of the other source/drain region of the drive transistor.

In the present disclosure including the above-described various preferable configurations, it is possible to use a current-driven light emitting unit in which light emission luminance changes according to a value of a flowing current. Examples of the current-driven light emitting unit include an organic electroluminescence element, an LED element, and a semiconductor laser element. These elements can be configured by utilization of well-known materials and methods. Specifically, from a viewpoint of forming a flat display device, it is preferable that the light emitting unit includes an organic electroluminescence element.

In the following, the display device and the electronic equipment of the present disclosure may be simply referred to as the present disclosure. In the present disclosure, the drive circuit can be formed on a semiconductor substrate, an insulating substrate on which a semiconductor material layer is formed, or the like. In a case where the drive circuit includes a transistor formed on the semiconductor substrate, a well region is provided in the semiconductor substrate made of silicon, and a transistor is formed in the well, for example.

Each of the display elements included in the pixels is formed on a certain plane (for example, formed on a substrate), and the light emitting unit is formed on an upper side of the drive circuit, which drives the light emitting unit, via an interlayer insulating layer, for example.

A conductivity type of the transistor used for the display element is not specifically limited. For example, the drive transistor, a write transistor (described later), or the like may include a p-channel transistor. In this case, the pixel emits light when a low-level voltage is applied to a gate of the drive transistor. Furthermore, the pixel is turned off when a sufficient high-level voltage is applied to the gate. In the following description, a state in which a video signal voltage corresponding to the highest luminance display in specifications of the display device is written in the pixel may be referred to as "white display", and a state in which a video signal voltage corresponding to the lowest luminance display in the specifications is written in the pixel may be referred to as "black display".

The capacitor included in the drive circuit can include one electrode, the other electrode, and a dielectric layer sandwiched between these electrodes. The transistor and the like included in the drive circuit are formed on a certain plane (for example, formed on a substrate), and the light emitting unit is formed on an upper side of the transistor and the capacitor, which are included in the drive circuit, via an interlayer insulating layer, for example. In addition, the other source/drain region of the drive transistor is connected to one end of the light emitting unit (anode electrode or the like provided in the light emitting unit) via a contact hole, for example. Note that the transistor may be formed on a semiconductor substrate or the like.

In two source/drain regions included in one transistor, a term "one source/drain region" may be used to mean a source/drain region connected to a power side. In addition, the transistor being in a conductive state means a state in which a channel is formed between the source/drain regions. It does not matter whether current flows from the one source/drain region to the other source/drain region of the transistor. On the other hand, the transistor being in a non-conductive state means a state in which no channel is formed between the source/drain regions. In addition, the source/drain regions can include not only a conductive substance such as polysilicon or amorphous silicon having impurities, but also a layer including metal, alloy, a conductive particle, a stacking structure thereof, or an organic material (conductive polymer).

Various wiring lines used in the display device can be formed by a combination of a well-known film forming method such as a physical vapor deposition method (PVD method), which is exemplified by a vacuum vapor deposition method or a sputtering method, or various chemical vapor deposition methods (CVD method), and a well-known patterning method such as an etching method or a lift-off method.

As a constituent material of the substrate, in addition to glass materials such as high strain point glass, soda glass ($Na_2O$—$CaO$—$SiO_2$), borosilicate glass ($Na_2O$-$B_2O_3$—$SiO_2$), forsterite ($2MgO$—$SiO_2$), and lead glass ($Na_2O$—$PbO$—$SiO_2$), polymer materials having flexibility, such as polymer materials exemplified by polyethersulfone (PES), polyimide, polycarbonate (PC), and polyethylene terephthalate (PET) can be exemplified. Note that various coatings may be applied to a surface of the substrate. When a substrate made of the polymer material having flexibility is used, a display device having flexibility can be configured.

A source driver or the like that drives the display device may be integrated by being integrated on the substrate or the like on which the display element is arranged, or may be configured as a separate body as appropriate. These can be configured by utilization of well-known circuit elements. For example, a vertical scanner and a power supply unit illustrated in FIG. 1 can be also configured by utilization of well-known circuit elements. In a use for which downsizing is required, such as a display device for a head mounted display or a viewfinder, it is preferable that the display element and the driver are formed on the same semiconductor substrate or the like.

The display device may have a so-called monochrome display configuration or a color display configuration. In a case of the color display configuration, one pixel may include a plurality of subpixels. Specifically, one pixel may include three subpixels that are a red light emitting subpixel, a green light emitting subpixel, and a blue light emitting subpixel. Furthermore, one set in which one kind or a plurality of kinds of subpixels is further added to these three kinds of subpixels (such as one set to which a subpixel that emits white light is added to improve luminance, one set to which a subpixel that emits light in a complementary color is added to expand a color reproduction range, one set to which a subpixel that emits yellow light is added to expand a color reproduction range, or one set to which subpixels that emit yellow and cyan light are added to expand a color reproduction range) may be included.

Some kinds of image display resolution such as (1920, 1035), (720, 480), and (1280, 960) can be exemplified as values of pixels (pixel) of the display device in addition to VGA (640, 480), S-VGA (800, 600), XGA (1024, 768), APRC (1152, 900), S-XGA (1280, 1024), U-XGA (1600, 1200), HD-TV (1920, 1080), and Q-XGA (2048, 1536). However, these values are not the limitations.

Furthermore, in addition to a direct-view or projection display device, various kinds of electronic equipment including an image display function can be exemplified as the electronic equipment including the display device of the present disclosure.

Various conditions in the present description are satisfied not only in a case of being mathematically strictly established but also in a case of being substantially established. Presence of various variations caused by design or manufacturing is acceptable. In addition, the drawings used in the following description are schematic, and do not indicate actual dimensions or ratios thereof. For example, FIG. 3 described later is a view illustrating a cross-sectional structure of the display device, but is not to illustrate a ratio of a width, height, thickness, and the like.

First Embodiment

The first embodiment relates to a display device, a driving method for the display device, and electronic equipment according to the present disclosure.

FIG. 1 is a conceptual diagram of a display device according to the first embodiment.

An outline of the display device will be described. A display device 1 is a display device in which display elements 70 included in pixels are arrayed in a row direction and a column direction in a two-dimensional matrix. The display device 1 includes a scanning line WS, a first feeder line PS1, and a second feeder line PS2 that are provided for each pixel row arrayed in the row direction (X direction in FIG. 1), and a data line DTL provided for each pixel column arrayed in the column direction (Y direction in FIG. 1). In a state of being connected to the scanning lines WS, the first feeder lines PS1, the second feeder lines PS2, and the data lines DTL, the total of N×M display elements 70 are arrayed in the two-dimensional matrix with N display elements 70 being in the row direction and M display elements 70 being in the column direction.

A pixel array unit 80 that displays an image includes the display elements 70 arrayed in the two-dimensional matrix. The number of rows of the display elements 70 in the pixel array unit 80 is M, and the number of the display elements 70 included in each row is N. In the following description, there is a case where the display elements 70 are referred to as pixels 70.

Each of the number of scanning lines WS, the number of first feeder lines PS1, and the number of second feeder lines PS1 is M. The pixels 70 in the m-th row (where m=1, 2, ..., and M) are connected to an m-th scanning line $WS_m$, an m-th first feeder line $PS1_m$, and an m-th second feeder line $PS2_m$, and are included in one pixel row.

Note that the M second feeder lines PS2 are all electrically connected. Thus, voltage supplied from the second feeder lines PS2 is applied to the pixels 70 at the same timing.

The number of data lines DTL is N. The pixels 70 in an n-th column (where n=1, 2, ..., and N) are connected to an n-th data line $DTL_n$.

Note that the display device 1 includes a common feeder line PSC commonly connected to all the pixels 70 although not illustrated in FIG. 1. For example, ground potential (0 V) is constantly supplied as a common voltage to the common feeder line PSC.

The display device 1 includes a source driver 110 to drive the pixel array unit 80, a vertical scanner 120, and a power supply unit 130.

The pixel array unit 80 is provided on a substrate 10 on which a semiconductor material layer including silicon is formed. Note that the source driver 110, the vertical scanner 120, and the power supply unit 130 are also formed on the substrate 10. That is, the display device 1 is a driver circuit-integrated display device. Note that various circuits that drive the pixel array unit 80 may be configured as separate bodies in some cases.

A signal $LD_{Sig}$ indicating gradation corresponding to an image to be displayed is input to the source driver 110 from, for example, a device (not illustrated). The signal $LD_{Sig}$ is, for example, a low-voltage digital signal. The source driver 110 is used to generate an analog signal corresponding to a gradation value of the video signal $LD_{Sig}$ and supply the analog signal as a video signal voltage to the data line DTL. The generated analog signal is a signal a maximum value of which is substantially equal to that of the drive voltage supplied to the source driver 110, and amplitude of which is about several volts.

The vertical scanner 120 supplies a scanning signal to the scanning lines WS. By this scanning signal, the pixels 70 are line-sequentially scanned, for example, in units of row. The description will be made on the assumption that the power supply unit 130 continuously supplies a predetermined drive voltage $V_{CC}$ (such as about 14 V) to the first feeder lines PS1 regardless of the scanning of the scanning lines WS.

The display device 1 is, for example, a display device of a color display, and a group including three pixels 70 arrayed in the row direction is included in one color pixel. Thus, when N'=N/3, with N' color pixels being in the row direction and M color pixels being in the column direction, the total of N'×M color pixels are arrayed in the pixel array unit 80.

As described above, the pixels 70 are line-sequentially scanned, for example, in units of row by the scanning signal of the vertical scanner 120. A pixel 70 located in the m-th row and the n-th column is hereinafter referred to as an (n, m)-th pixel 70.

In the display device 1, N pixels 70 arrayed in the m-th row are simultaneously driven. In other words, in the N pixels 70 arrayed in the row direction, light emission/non-light emission timing thereof is controlled in units of row to which the pixels belong. When a display frame rate of the display device 1 is expressed as FR (times/second), a scanning period per row (so-called horizontal scanning period) of when the display device 1 is line-sequentially scanned in units of row is shorter than (1/FR)×(1/M) seconds.

The outline of the display device 1 has been described above. Next, details of the display elements (pixel) 70 will be described.

Figure 2:
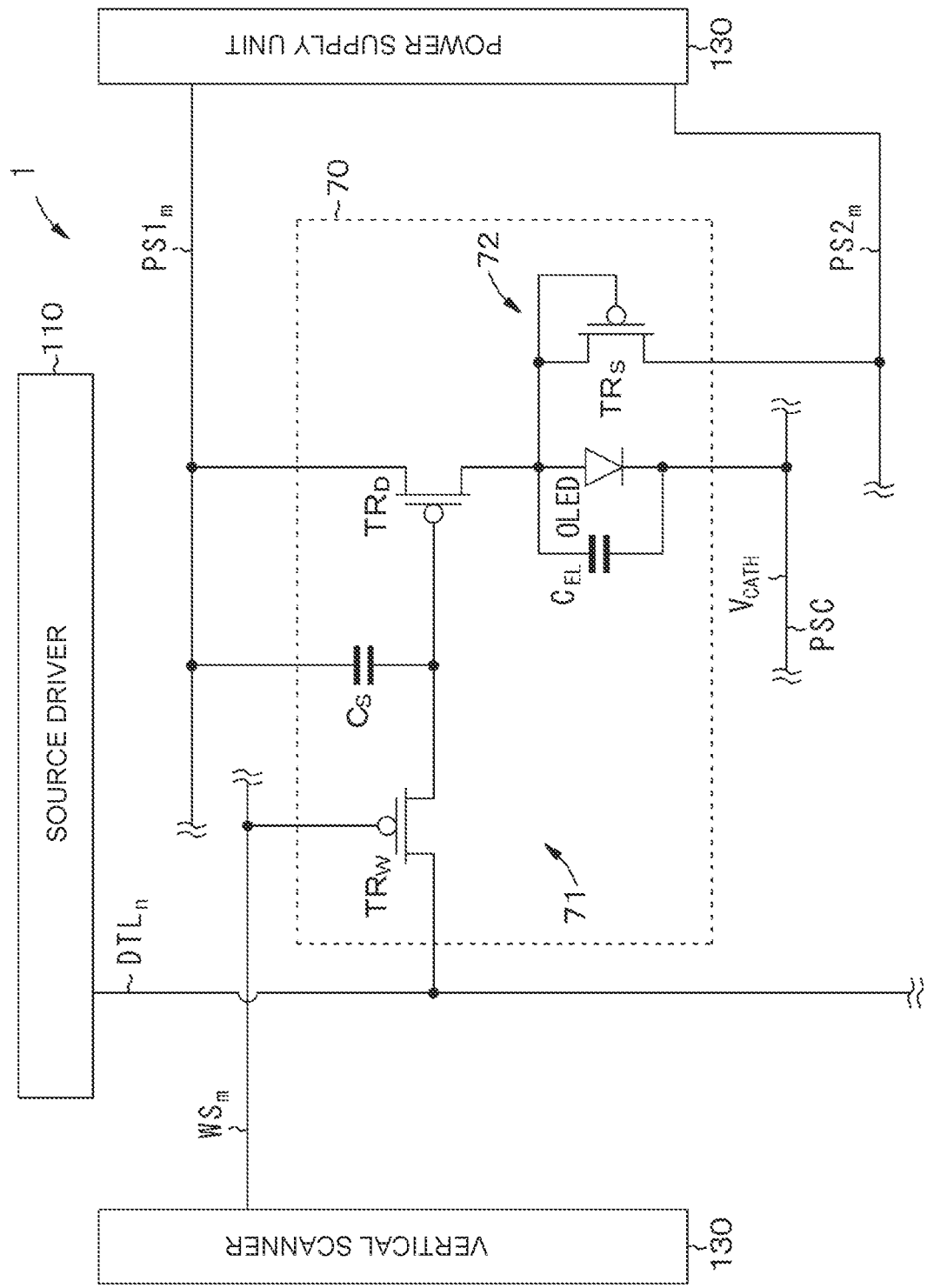
FIG. 2 is a schematic circuit diagram of a display element (pixel) including a light emitting unit and a drive circuit to drive the light emitting unit.

FIG. 2 is a schematic circuit diagram of a display element (pixel) including a light emitting unit and a drive circuit to drive the light emitting unit. Note that a connection relationship of one pixel 70, more specifically, the (n, m)-th pixel 70 is illustrated in FIG. 2, for convenience of illustration.

As illustrated in FIG. 2, the display element (pixel) 70 includes a current-driven light emitting unit OLED and a drive circuit 71 to drive the light emitting unit OLED. The drive circuit 71 includes at least a drive transistor $TR_D$ and a capacitor $C_S$, and further includes a write transistor $TR_W$ to write a video signal voltage. These include p-channel transistors.

The capacitor $C_S$ is used to hold a voltage of a gate electrode with respect to a source region (so-called gate-source voltage) of the drive transistor $TR_D$. At the time of light emission of the pixel 70, one source/drain region (side connected to the first feeder line $PS1_m$ in FIG. 2) of the drive transistor $TR_D$ serves as the source region, and the other source/drain region serves as a drain region.

One electrode and the other electrode included in the capacitor $C_S$ are respectively connected to the one source/drain region and the gate electrode of the drive transistor $TR_D$. The other source/drain region of the drive transistor $TR_D$ is connected to an anode electrode of the light emitting unit OLED.

In addition, a voltage setting circuit 72 including a diode-connected transistor $TR_S$ is connected to the other source/drain region of the drive transistor $TR_D$. The transistor $TR_S$ is a p-channel transistor, and one end of the diode-connected transistor $TR_S$ is connected to the other source/drain region of the drive transistor $TR_D$. The other end of the diode-connected transistor $TR_S$ is connected to the second feeder line $PS2_m$.

As described later in detail with reference to FIG. 6 to FIG. 11, for example, at the time of activation of the display device 1, the voltage of the other source/drain region of the drive transistor $TR_D$ is set by the voltage setting circuit 72 connected to the other source/drain region of the drive transistor $TR_D$. Specifically, a voltage higher than a voltage during normal operation is supplied to the second feeder line PS2. As a result, the voltage of the other source/drain region of the drive transistor $TR_D$ is set.

The light emitting unit OLED is a current-driven light emitting unit, in which light emission luminance changes according to a value of a flowing current, and specifically includes an organic electroluminescence light emitting unit. The light emitting unit OLED has a known configuration and structure including an anode electrode, a hole transport layer, a light emitting layer, an electron transport layer, a cathode electrode, and the like.

The light emitting unit OLED has a structure in which an organic layer is sandwiched between the anode electrode and the cathode electrode, various layers including the light emitting layer and the like being stacked in the organic layer. In a case where the display device performs the color display, a configuration in which the light emitting unit OLED corresponding to a red display pixel includes a red light emitting layer, the light emitting unit OLED corresponding to a green display pixel includes a green light emitting layer, and the light emitting unit OLED corresponding to a blue display pixel includes a blue light emitting layer can be employed. Alternatively, a configuration in which the light emitting unit OLED emits white light regardless of a display color of a pixel and the color display is performed via a color filter arranged according to the pixel can be employed. In a case where the light emitting unit OLED displays white, for example, a configuration in which the organic layer has a structure in which the red light emitting layer, the blue light emitting layer, and the green light emitting layer are stacked or a structure in which blue light emission and yellow light emission are stacked is employed.

The other end (specifically, cathode electrode) of the light emitting unit OLED is connected to the common feeder line PSC independent of the second feeder line PS2. A predetermined voltage $V_{CATH}$ (such as ground potential) is supplied to the common feeder line PSC. Note that capacitance of the light emitting unit OLED is indicated by a reference sign $C_{EL}$. In a case where the capacitance $C_{EL}$ of the light emitting unit OLED is small and a problem occurs in driving the pixel 70, an auxiliary capacitance connected in parallel to the light emitting unit OLED may be provided as necessary.

The write transistor $TR_W$ has a gate electrode connected to the scanning line WS, one source/drain region connected to the data line DTL, and the other source/drain region connected to the gate electrode of the drive transistor $TR_D$. As a result, the video signal voltage from the data line DTL is written to the capacitor $C_S$ via the write transistor $TR_W$.

As described above, the capacitor $C_S$ is connected between the one source/drain region and the gate electrode of the drive transistor $TR_D$. The drive voltage $V_{CC}$ is applied from the power supply unit 130 to the one source/drain region of the drive transistor $TR_L$ via the first feeder line $PS1_m$. When the video signal voltage $V_{Sig}$ from the data line DTL is written into the capacitor $C_S$ via the write transistor $TR_W$, the capacitor $C_S$ holds a voltage such as ($V_{Sig}-V_{CC}$) as a gate-source voltage of the drive transistor $TR_D$. A drain current $I_{ds}$ expressed by the following expression (1) flows in the drive transistor $TR_D$, and the light emitting unit OLED emits light with luminance corresponding to a current value.

$$I_{ds}=k\cdot\mu(|V_{Sig}-V_{CC}|-|V_{th}|)^2 \quad (1)$$

Note that it is assumed that
μ: effective mobility
L: channel length
W: channel width
$V_{th}$: threshold voltage
$C_{ox}$: (relative permittivity of gate insulating layer)×(permittivity of vacuum)/(thickness of gate insulating layer)
k=(½)·(W/L)·$C_{ox}$.

Figure 3:
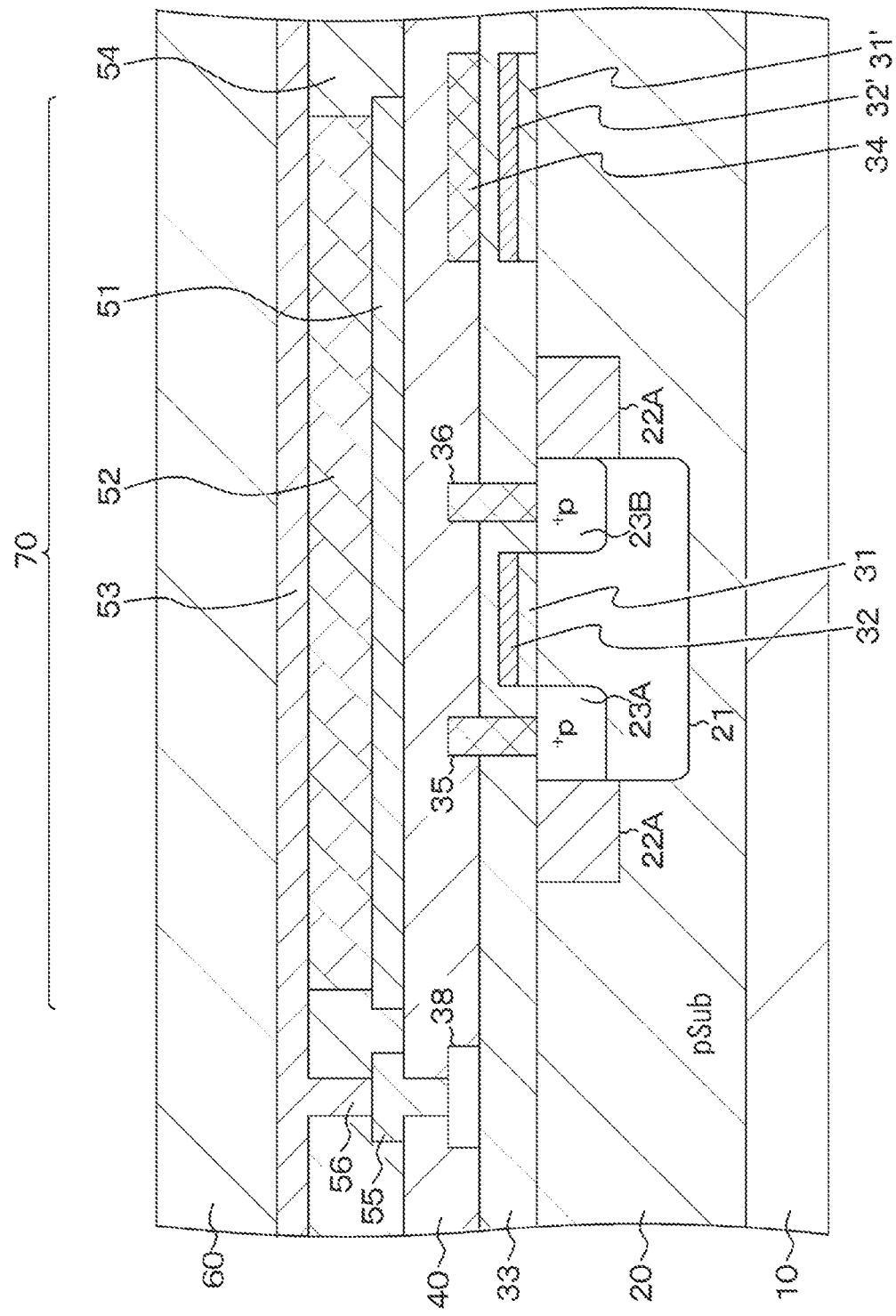
FIG. 3 is a schematic partial cross-sectional view of a portion including the display element (pixel) in the display device.

Here, a three-dimensional arrangement relationship of the light emitting unit OLED, the transistor, and the like will be described. FIG. 3 is a schematic partial cross-sectional view of a portion including the display element (pixel) in the display device.

The drive circuit 71 in the pixel 70 is provided on the substrate 10 on which the semiconductor material layer 20 including silicon is formed. The drive transistor $TR_D$, the write transistor $TR_W$, and the transistor $TR_S$ are provided in an n-channel well 21 formed in the semiconductor material layer 20. Note that only the write transistor $TR_W$ is illustrated in FIG. 3 for convenience of illustration. Reference signs 23A and 23B indicate a pair of source/drain regions of the write transistor $TR_W$.

Each transistor is surrounded by an element isolation region 22A. A reference sign 32 indicates a gate electrode of the transistor $TR_W$, and a reference sign 31 indicates a gate insulating layer. The element isolation region 22A is formed by a shallow trench isolation (STI) structure in which an insulator is embedded in a groove carved in the surface of the semiconductor substrate.

One electrode 32' included in the capacitor $C_S$ is formed of a material layer the same as that of the gate electrode 32, and is formed on an insulating layer 31' formed of a material layer the same as that of the gate insulating layer 31. An interlayer insulating layer 33 is formed on the entire surface of the semiconductor material layer 20 including the gate electrode 32 and the electrode 32'. The other electrode 34 included in the capacitor $C_S$ can be formed together in a step of forming a contact plug 35 or the like (described later), for example. The electrode 34 is arranged in such a manner as to face the electrode 32' with the interlayer insulating layer 33 interposed therebetween.

In the write transistor $TR_W$, one source/drain region 23A is connected to the data line DTL (not illustrated) via the contact plug 35 provided in the interlayer insulating layer 33. In addition, via a contact plug 36 provided in the interlayer insulating layer 33, the other source/drain region 23B is connected to the gate electrode of the drive transistor $TR_D$ and the other electrode 34 included in the capacitor $C_S$. Note that each of the above-described connection portions is hidden and not visible in FIG. 3.

An interlayer insulating layer 40 is further formed on the interlayer insulating layer 33. A light emitting unit OLED including an anode electrode 51, a hole transport layer, a light emitting layer, an electron transport layer, and a cathode electrode 53 is provided on the interlayer insulating layer 40. Note that the hole transport layer, the light emitting layer, and the electron transport layer are illustrated as one layer 52 in the drawing. A second interlayer insulating layer 54 is provided on a part of the interlayer insulating layer 40 on which part the light emitting unit OLED is not provided, a transparent substrate 60 is arranged on the second interlayer insulating layer 54 and the cathode electrode 53, and light emitted from the light emitting layer passes through the substrate 60 and is emitted to the outside.

The anode electrode 51 and the other source/drain region of the drive transistor $TR_D$ are connected via a contact hole or the like (not illustrated) provided in the interlayer insulating layer 33. Note that the connection portion is hidden and not visible in FIG. 3.

In addition, the cathode electrode 53 is connected to a common feeder line PSC, which is provided on an extending portion of the interlayer insulating layer 33 and indicated by a reference sign 38, via the contact plugs 56 and 55 provided in the second interlayer insulating layer 54 and the interlayer insulating layer 40. The voltage $V_{CATH}$ is supplied to the common feeder line 38 as a voltage common to the pixels 70.

In the above, a three-dimensional arrangement relationship of the light emitting unit OLED, the transistor, and the like has been described. Next, in order to facilitate understanding of the present disclosure, a problem of a display device according to a reference example will be described.

Note that it is assumed, for convenience of description, that a design voltage of the drive voltage $V_{CC}$ is 14 V, a design withstand voltage between the source and the drain of the drive transistor $TR_D$ is 16 V, and a threshold voltage $V_{th\_EL}$ of the light emitting unit OLED is 4 V. However, this is merely an example.

Figure 4:
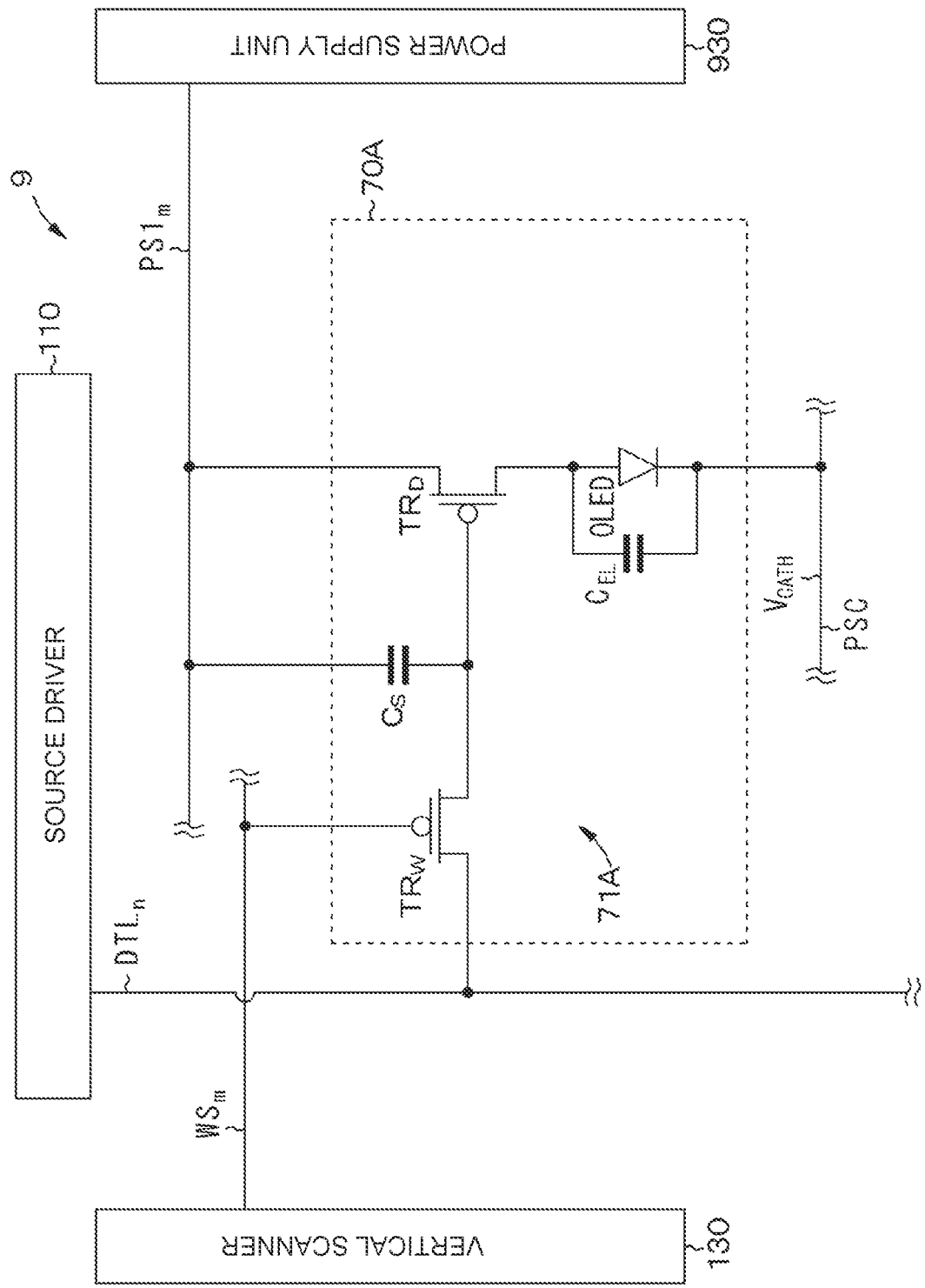
FIG. 4 is a schematic circuit diagram of a display element (pixel) including a light emitting unit and a drive circuit to drive the light emitting unit in a display device of a reference example.

FIG. 4 is a schematic circuit diagram of a display element (pixel) including a light emitting unit and a drive circuit to drive the light emitting unit in the display device of the reference example.

A pixel 70A used in a display device 9 of the reference example illustrated in FIG. 4 has a configuration in which the voltage setting circuit 72 including the diode-connected transistor $TR_S$ is omitted from the pixel 70 used in the display device 1. A drive circuit of the pixel 70A is indicated by a reference sign 71A.

In a case where a p-channel drive transistor $TR_D$ is used, a gate-source voltage (so-called $V_{gs}$) of the drive transistor $TR_D$ needs to be set to a negative potential in order to cause the light emitting unit OLED to emit light. For convenience, it is assumed in the following description that a threshold voltage $V_{th}$ of the drive transistor $TR_D$ is −1 V, a video signal voltage for white display is [$V_{CC}$−2 V], and the display device operates in the white display. The same applies to other embodiments.

FIG. 5A to FIG. 7B are schematic circuit diagrams for describing transition of the display device of the reference example from an operating state to a non-operating state, and re-activation to the operating state. Note that operation of one pixel 70A, more specifically, an (n, m)-th pixel 70A is illustrated, for convenience of description.

First, a state in which the display device 9 is operating in a white display state will be described with reference to FIG. 5A.

In a case where a certain pixel 70 is displayed in white, [$V_{CC}$−2 V] is supplied from a source driver 110 to a data line $DTL_n$, and in this state, a write transistor $TR_W$ is brought into a conductive state and then into a non-conductive state. Since the drive voltage $V_{CC}$ is applied from a first feeder line $PS1_m$ to one source/drain region of the drive transistor $TR_D$ and $V_{gs}$ is held at [−2 V] by a capacitor $C_S$, a drain current $I_{DS}$ corresponding to the white display can be made to flow in the light emitting unit OLED.

Next, a state in which the display device 9 transitions to the non-operating state will be described with reference to FIG. 5B, FIG. 6A, and FIG. 6B.

When the display device 9 is turned off and becomes the non-operating state, the voltage of the first feeder line $PS1_m$ becomes, for example, $V_{SS}$ that is a ground potential. When the threshold voltage of the light emitting unit OLED is expressed as $V_{th\_EL}$, a voltage of an anode electrode of the light emitting unit OLED and the other source/drain region of the drive transistor TR, connected thereto becomes [$V_{th\_EL}+V_{CATH}$] (see FIG. 5B).

Figure 6A:
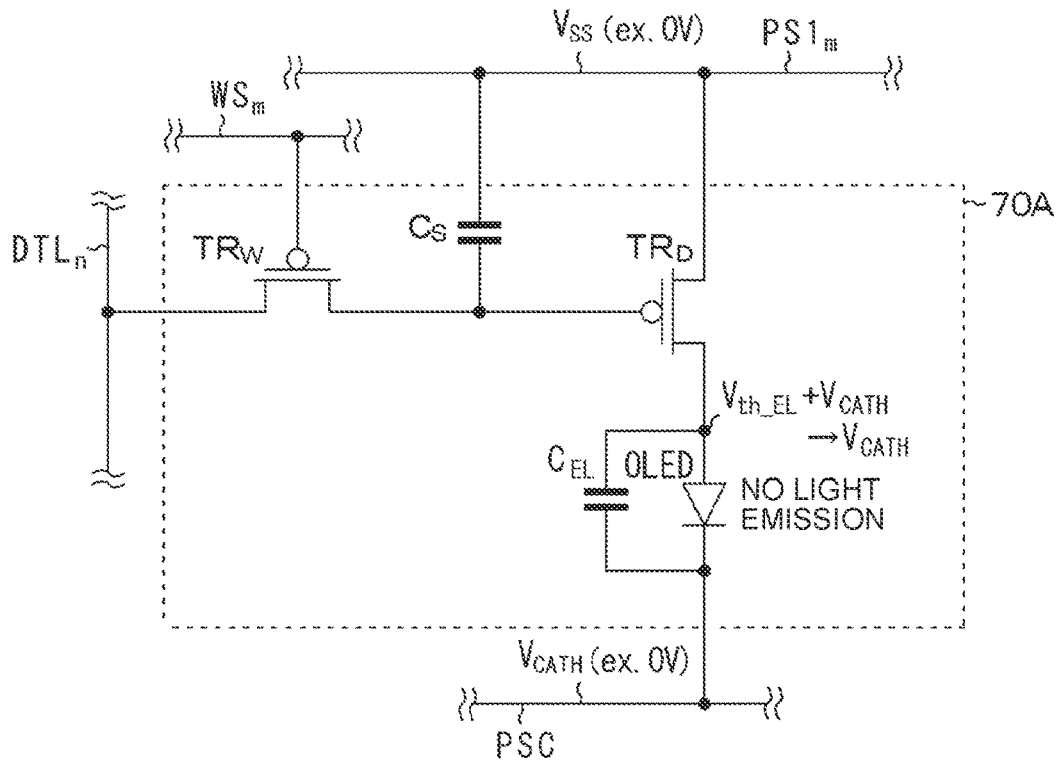
FIG. 6A is a schematic circuit diagram for describing the state of the display element of when the non-operating state of the display device of the reference example elapses, following FIG. 5B.

As the non-operating state continues, a charge held in capacitance $C_{EL}$ of the light emitting unit OLED flows out, and the voltage of the anode electrode of the light emitting unit OLED changes toward $V_{CATH}$ (see FIG. 6A). When sufficient time elapses, the voltage of the anode electrode of the light emitting unit OLED becomes $V_{CATH}$ (see FIG. 6B).

Subsequently, a state of when the display device 9 is activated will be described with reference to FIG. 7A and FIG. 7B.

Figure 6B:
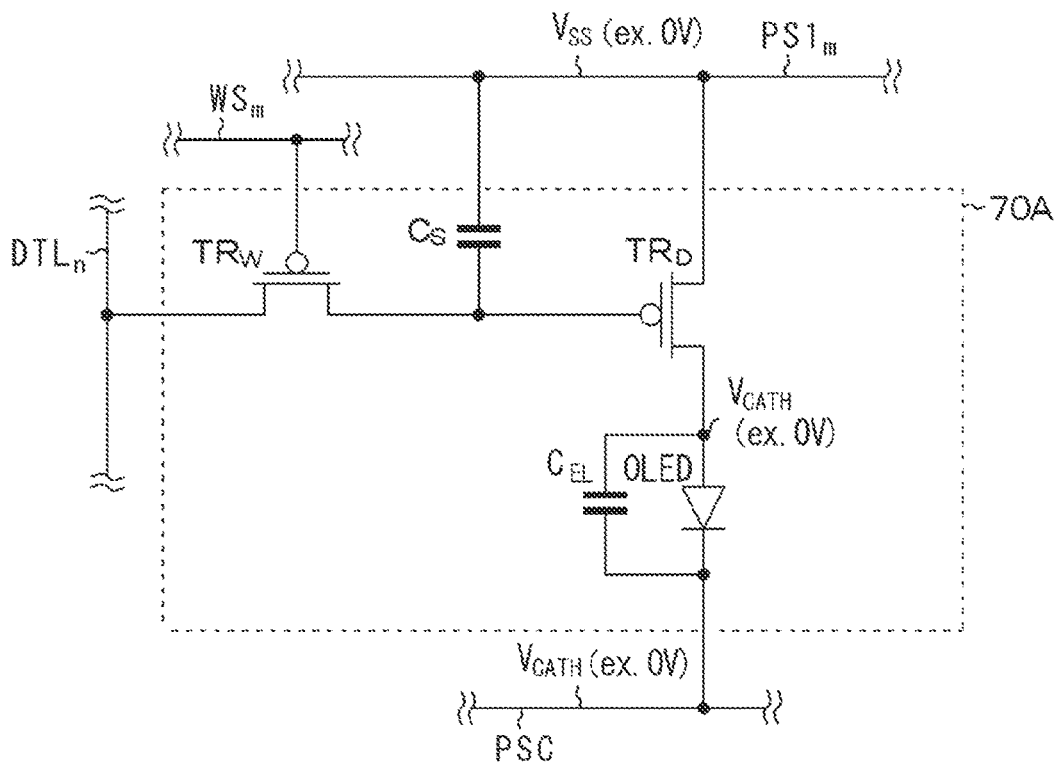
FIG. 6B is a schematic circuit diagram for describing the state of the display element of when the non-operating state of the display device of the reference example sufficiently elapses, following FIG. 6A.
Figure 7A:
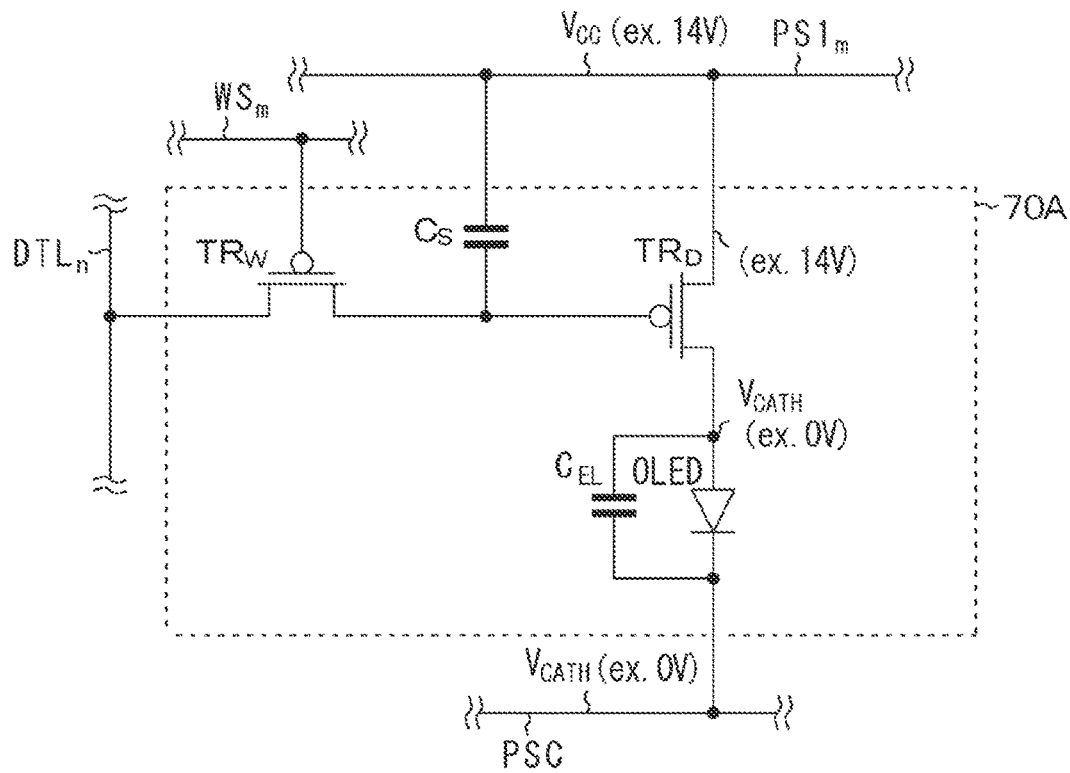
FIG. 7A is a schematic circuit diagram for describing the state of the display element of when voltage of a design value is applied to the display element at the time of activation in the display device of the reference example, following FIG. 6B.

When the display device 9 in a state illustrated in FIG. 6B is activated, the drive voltage $V_{CC}$ is applied from the first feeder line $PS1_m$ to the one source/drain region of the drive transistor $TR_D$ in a state in which the voltage of the anode electrode of the light emitting unit OLED is $V_{CATH}$ (0 V) (see FIG. 7A). When the drive voltage $V_{CC}$ as designed (14 V) is applied from the first feeder line $PS1_m$, the voltage between the source and the drain of the drive transistor $TR_L$ at this time is 14 V, and does not exceed the design withstand voltage of 16 V.

Figure 7B:
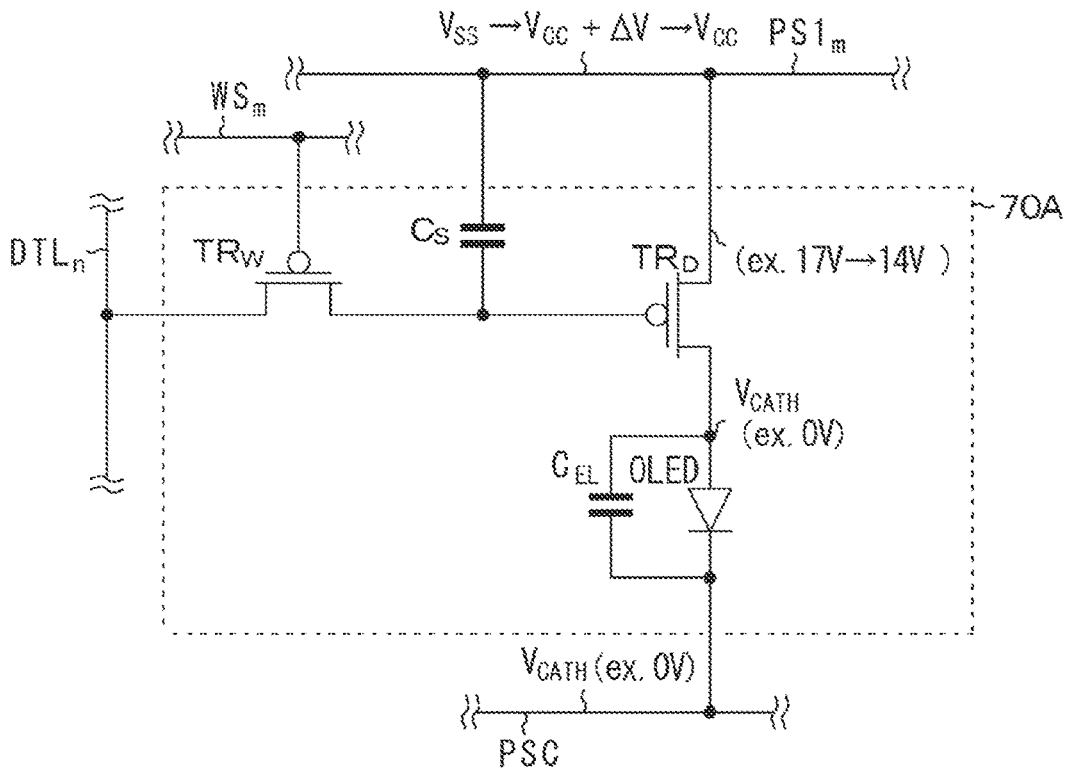
FIG. 7B is a schematic circuit diagram for describing the state of the display element of when voltage exceeding the design value is applied to the display element at the time of activation in the display device of the reference example, following FIG. 6B.

On the other hand, when the display device 9 in a state illustrated in FIG. 6B is activated, there may be a case where a high voltage exceeding the design value [$V_{CC}+\Delta V$] is instantaneously supplied from the first feeder line $PS1_m$, and then transitions to the drive voltage [$V_{CC}$] (see FIG. 7B). For example, in a case where $\Delta V$ is 3 V, the voltage of the one source/drain region of the drive transistor $TR_L$ transitions from 17 V to 14 V, as illustrated in FIG. 7B. Thus, a voltage exceeding the design withstand voltage of 16 V is applied to the drive transistor $TR_D$ and an overvoltage breakdown of the transistor is caused.

The problem of the display device according to the reference example has been described above.

Then, in the present disclosure, after the voltage of the other source/drain region of the drive transistor is set in such a manner that a difference between the voltage of the other source/drain region of the drive transistor and the drive voltage is decreased, the drive voltage is applied to the one source/drain region of the drive transistor. As a result, an overvoltage breakdown of the transistor used for the display element can be prevented.

FIG. 8A to FIG. 12B are schematic circuit diagrams for describing transition of the display device according to the first embodiment from an operating state to a non-operating state, and re-activation to the operating state. Note that operation of one pixel 70, more specifically, the (n, m)-th pixel 70 is illustrated, for convenience of description.

In the first embodiment, for example, at the time of activation of the display device 1, a step of setting a voltage of the other source/drain region of the drive transistor $TR_D$ in such a manner that a difference between the voltage of the other source/drain region of the drive transistor $TR_D$ and the drive voltage is decreased, and a step of applying the drive voltage $V_{CC}$ to the one source/drain region of the drive transistor $TR_D$ thereafter are performed.

Figure 8A:
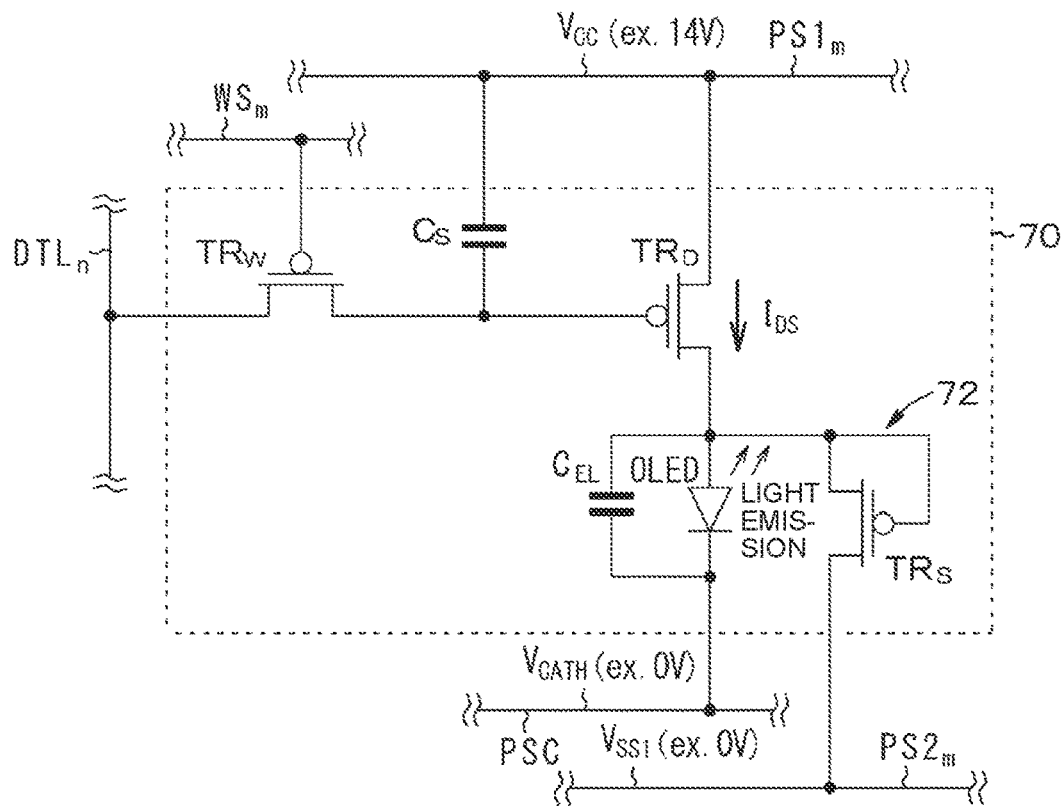
FIG. 8A is a schematic circuit diagram for describing an operating state of the display element of when the display device according to the first embodiment is in an operating state.

First, a state in which the display device 1 is operating in the white display state will be described with reference to FIG. 8A.

Figure 5A:
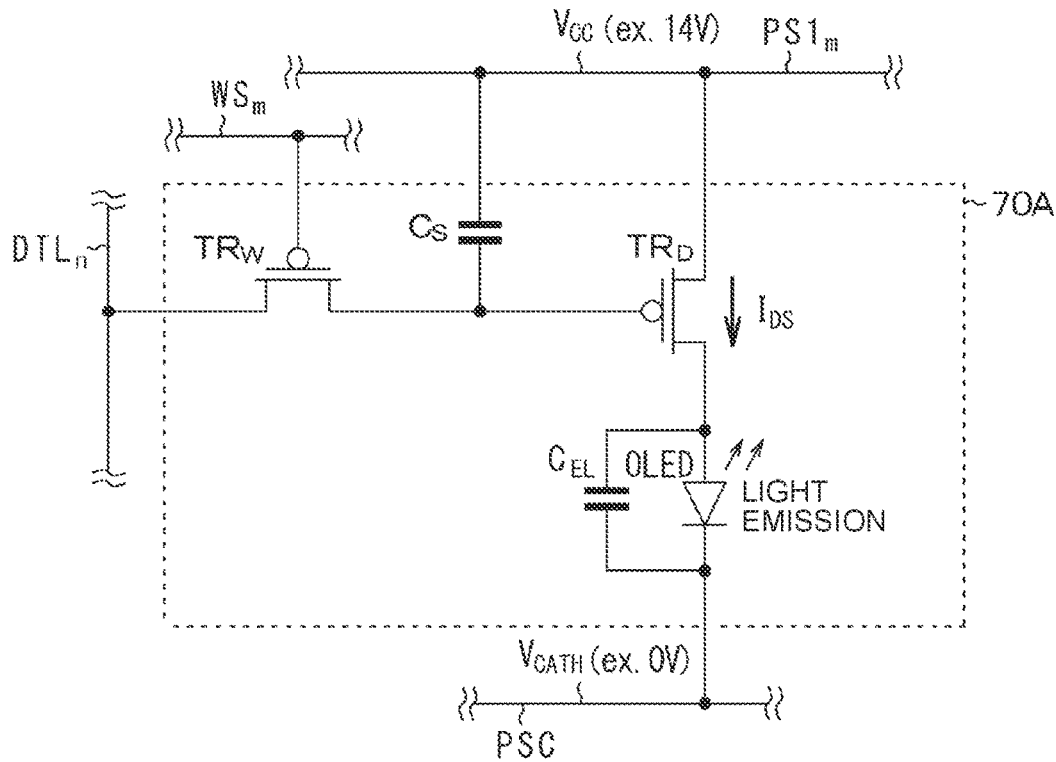
FIG. 5A is a schematic circuit diagram for describing an operating state of the display element of when the display device of the reference example is in an operating state.
Figure 5B:
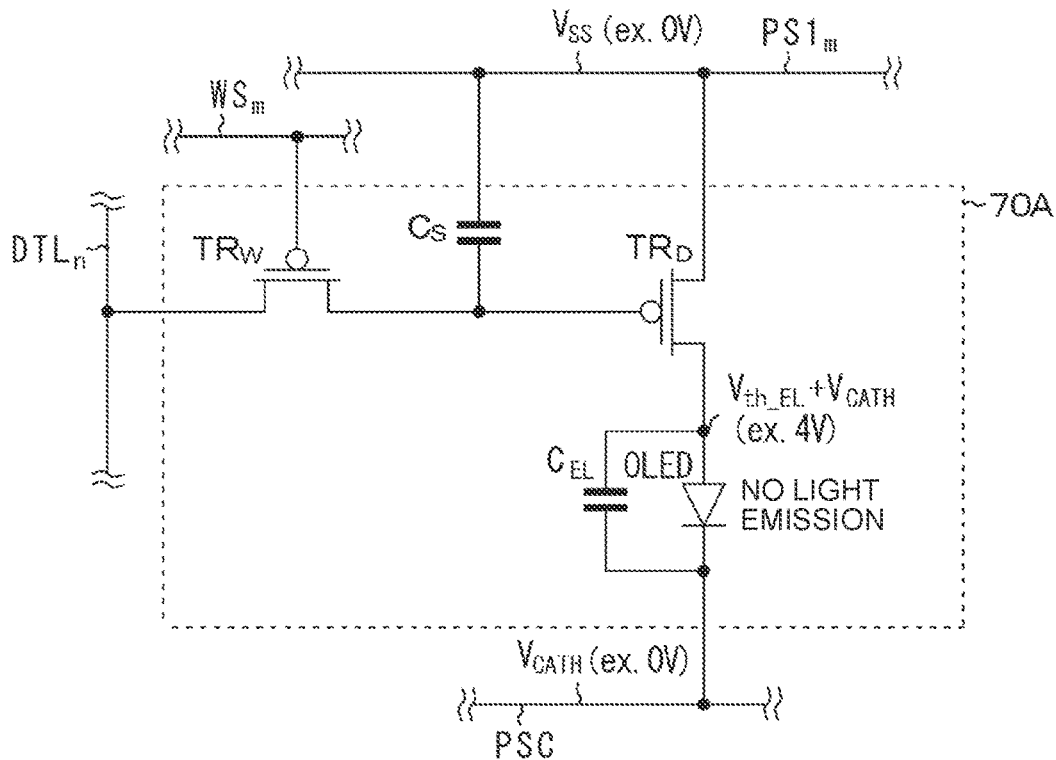
FIG. 5B is a schematic circuit diagram for describing a state of the display element of when the display device of the reference example is switched from the operating state to a non-operating state, following FIG. 5A.

Similarly to the description in FIG. 5A, since the drive voltage $V_{CC}$ is applied from the first feeder line $PS1_m$ to the one source/drain region of the drive transistor $TR_D$ and $V_{gs}$ is held at [−2 V] by the capacitor $C_S$, the drain current $I_{DS}$ corresponding to the white display can be made to flow in the light emitting unit OLED. A voltage $V_{SS1}$ (such as ground potential) is applied to the second feeder line $PS2_m$.

Figure 8B:
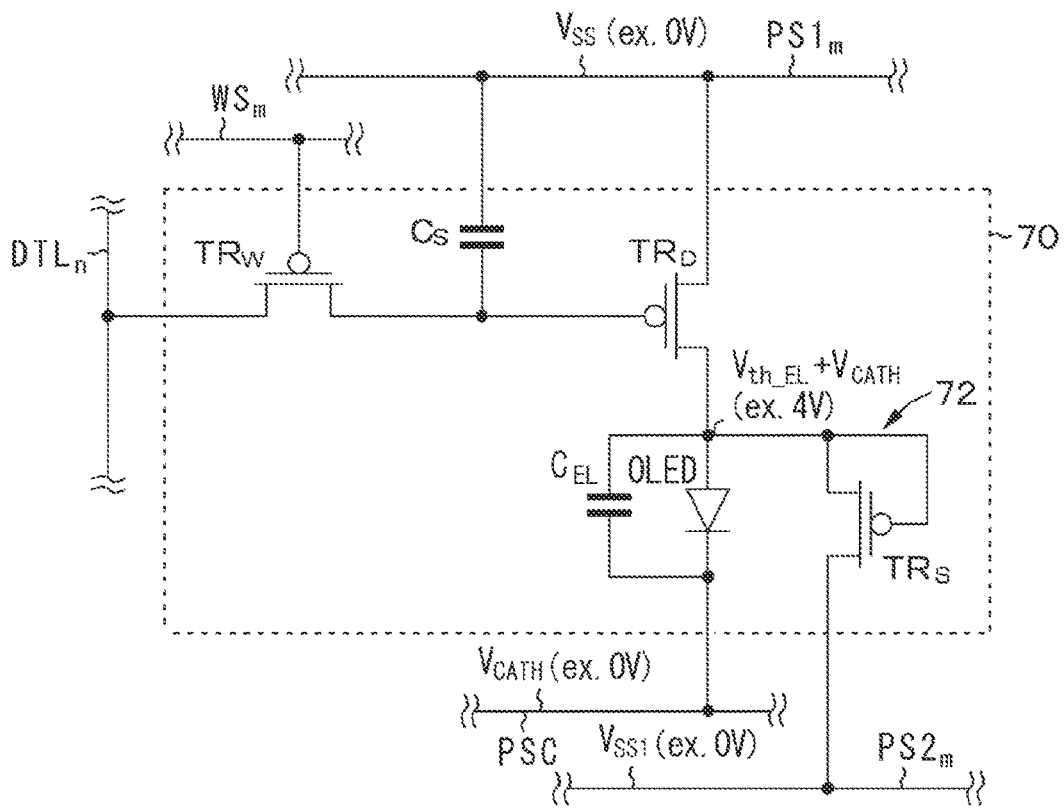
FIG. 8B is a schematic circuit diagram for describing a state of the display element of when the display device according to the first embodiment is switched from the operating state to a non-operating state, following FIG. 8A.

Next, a state in which the display device 1 transitions to the non-operating state will be described with reference to FIG. 8B, FIG. 9A, and FIG. 9B.

When the display device 1 is turned off and becomes the non-operating state, the voltage of the first feeder line PS1, becomes, for example, $V_{SS}$ that is the ground potential. The voltage of the second feeder line PS2, is $V_{SS1}$. Similarly to the description in FIG. 5B, the voltage of the anode electrode of the light emitting unit OLED and the other source/drain region of the drive transistor $TR_D$ connected thereto becomes [$V_{th\_EL}+V_{CATH}$] (see FIG. 8B).

Figure 9A:
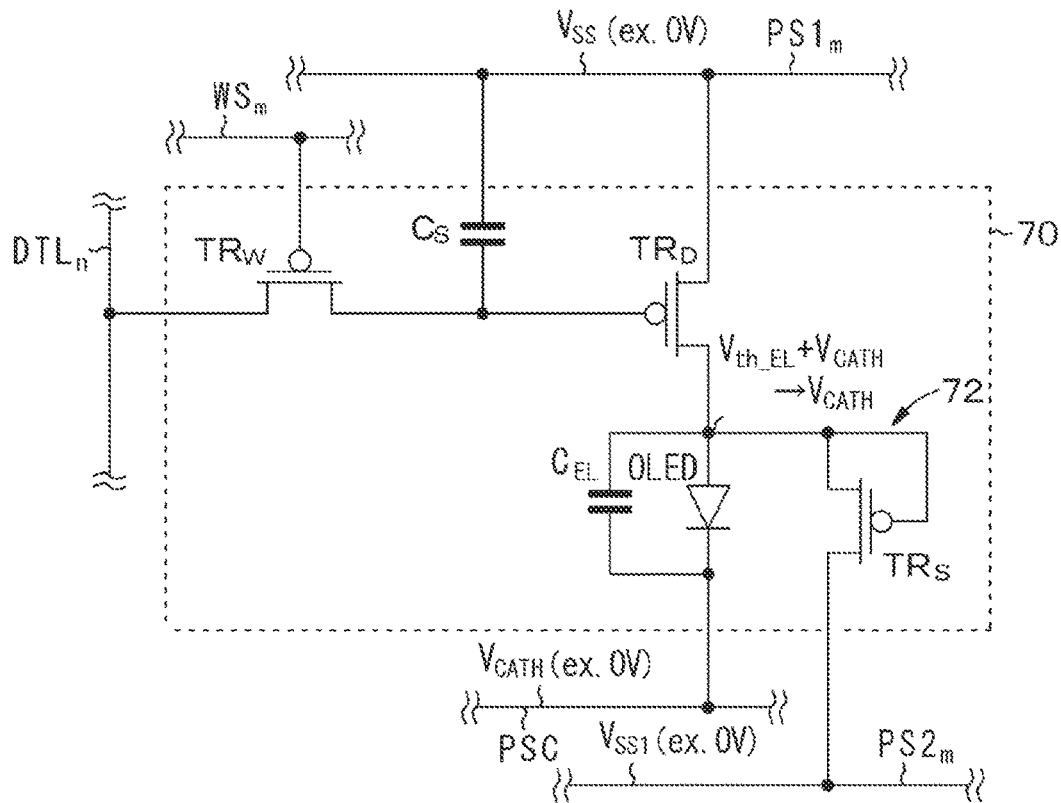
FIG. 9A is a schematic circuit diagram for describing the state of the display element of when time elapses after the display device according to the first embodiment is switched to the non-operating state, following FIG. 8B.
Figure 9B:
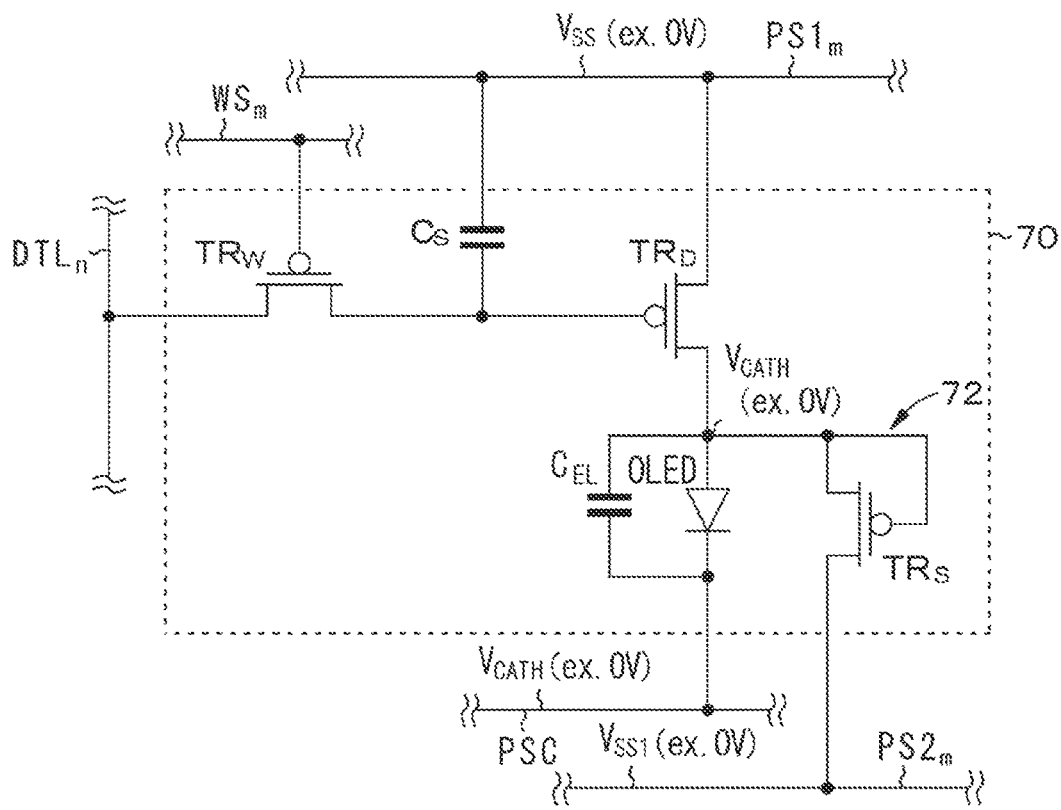
FIG. 9B is a schematic circuit diagram for describing the state of the display element of when time sufficiently elapses after the display device according to the first embodiment is switched to the non-operating state, following FIG. 9A.
Figure 10A:
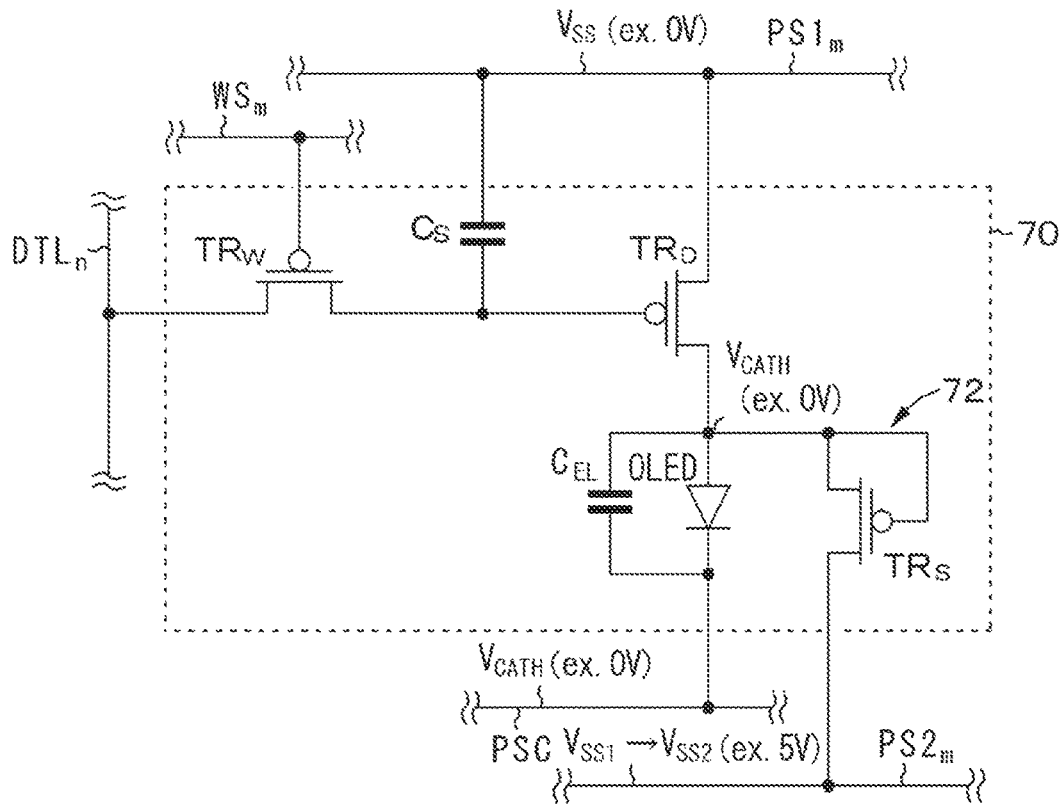
FIG. 10A is a schematic circuit diagram for describing the state of the display element at the time of activation in the display device according to the first embodiment, following FIG. 9B.
Figure 10B:
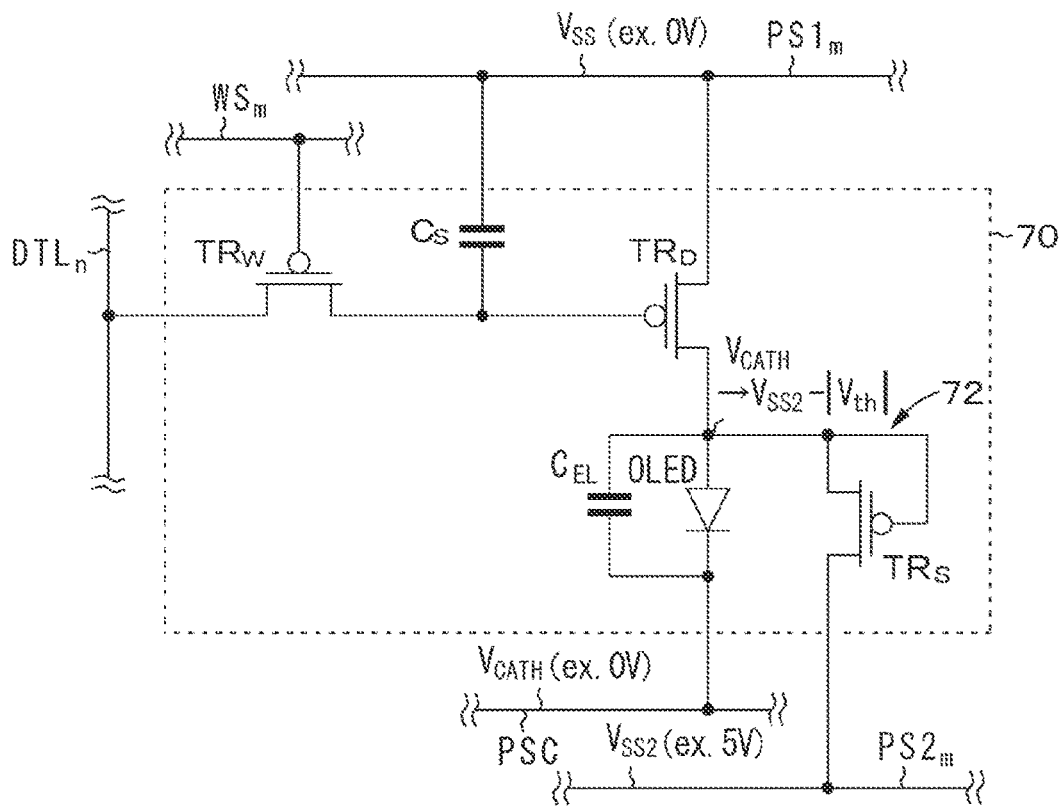
FIG. 10B is a schematic circuit diagram for describing the state of the display element at the time of the activation in the display device according to the first embodiment, following FIG. 10A.

As the non-operating state continues, a charge held in the capacitance $C_{EL}$ of the light emitting unit OLED flows out, and the voltage of the anode electrode of the light emitting unit OLED changes toward $V_{CATH}$ (see FIG. 9A). When sufficient time elapses, the voltage of the anode electrode of the light emitting unit OLED becomes $V_{CATH}$ (see FIG. 9B).

Subsequently, a state of when the display device 1 is activated will be described with reference to FIG. 10A to FIG. 12B. Note that a threshold voltage of the transistor $TR_S$ is also expressed by utilization of a reference sign $V_{th}$, and it is assumed that a value thereof is −1 V, for convenience of description.

In the first embodiment, voltage is applied to the other end of the diode-connected transistor $TR_S$, whereby the voltage of the other source/drain region of the drive transistor is set. More specifically, for example, at the time of activation of the display device 1, a voltage $V_{SS2}$ (such as 5 V) higher than the voltage $V_{SS1}$ during normal operation is supplied to the second feeder line $PS2_m$ connected to the other end of the transistor $TR_S$ (see FIG. 10A).

Figure 11A:
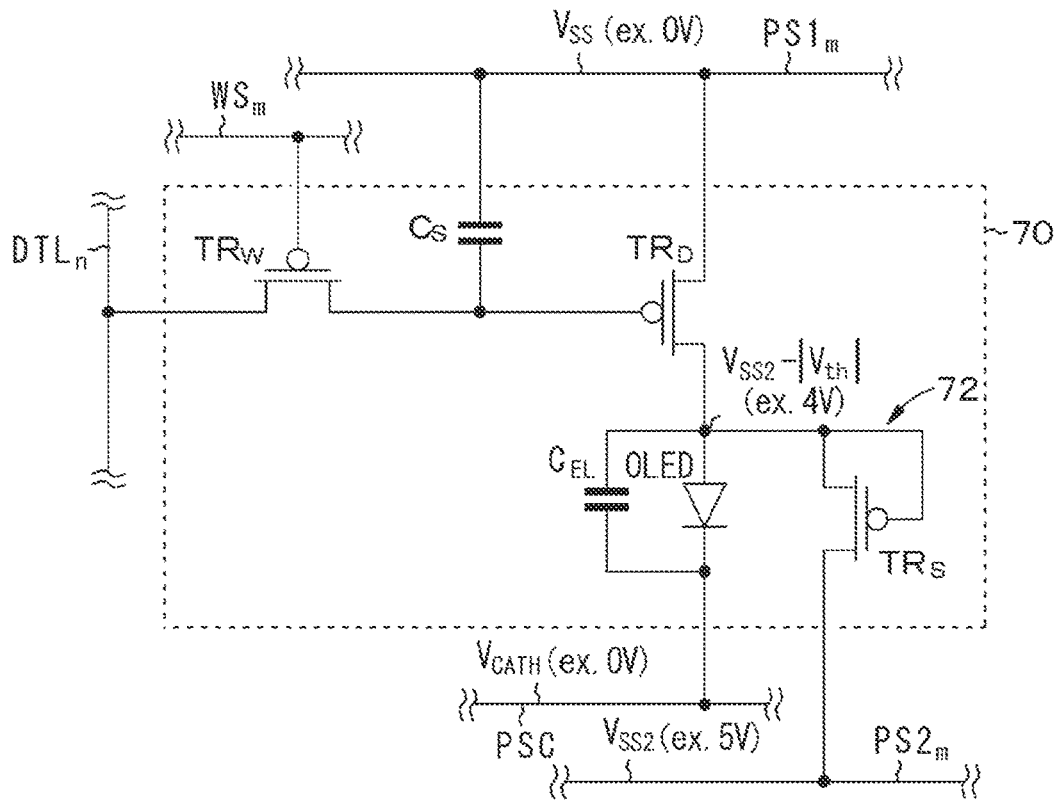
FIG. 11A is a schematic circuit diagram for describing the state of the display element at the time of the activation in the display device according to the first embodiment, following FIG. 10B.

Since the transistor $TR_S$ is diode-connected, the voltage of the anode electrode of the light emitting unit OLED changes from $V_{CATH}$ toward $[V_{SS2}-|V_{th}|]$ (see FIG. 10B), and the voltage of the anode electrode of the light emitting unit OLED finally becomes $[V_{S2}-|V_{th}|]$ (see FIG. 11A). When $|V_{th}|$ is 1 V, $[V_{SS2}-|V_{th}|]$ becomes a voltage corresponding to the threshold voltage $V_{th\_EL}$ of the light emitting unit OLED. Thus, the voltage of the anode electrode of the light emitting unit OLED is set to about 4 V. In other words, a value of $V_{SS2}$ is set in such a manner that $[V_{SS2}-|V_{th}|]$ becomes substantially similar to the threshold voltage $V_{th\_EL}$ of the light emitting unit OLED.

In such a manner, the voltage corresponding to the threshold voltage $V_{th\_EL}$ of the light emitting unit OLED is set as the voltage of the other source/drain region of the drive transistor $TR_D$.

Then, the drive voltage $V_{CC}$ is applied from the first feeder line $PS1_m$ to the one source/drain region of the drive transistor $TR_D$. At this time, it is assumed that a high voltage exceeding the design value $[V_{CC}+\Delta V]$ is instantaneously supplied from the first feeder line $PS1_m$ and then transitions to the drive voltage $[V_{CC}]$ (see FIG. 11B).

Figure 11B:
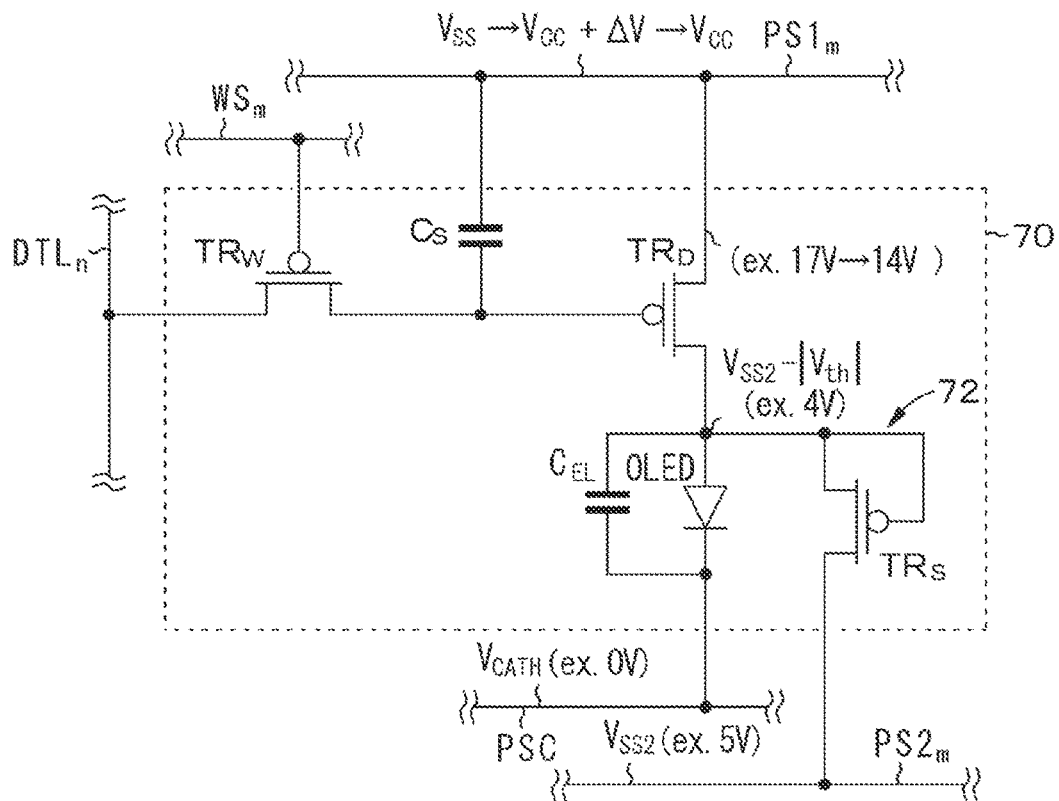
FIG. 11B is a schematic circuit diagram for describing the state of the display element at the time of the activation in the display device according to the first embodiment, following FIG. 11A.

In this case, as illustrated in FIG. 11B, the voltage of the one source/drain region of the drive transistor $TR_D$ transitions from 17 V to 14 V. However, the voltage of the anode electrode of the light emitting unit OLED is set to about 4 V. Thus, unlike the display device 9 of the reference example, a voltage exceeding the design withstand voltage of 16 V is not applied to the drive transistor $TR_D$. This can avoid causing an overvoltage breakdown of the transistor.

Figure 12A:
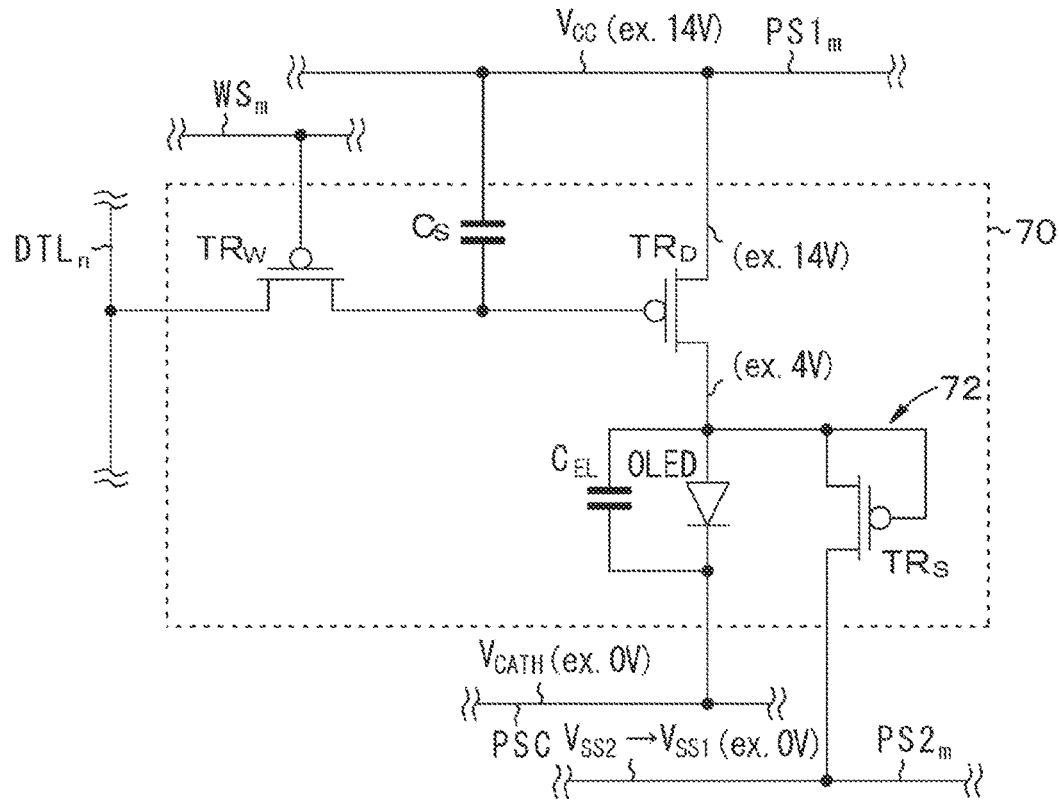
FIG. 12A is a schematic circuit diagram for describing the state of the display element at the time of the activation in the display device according to the first embodiment, following FIG. 11B.

Subsequently, the voltage of the second feeder line $PS2_m$ is switched from $V_{SS2}$ to the voltage $V_{SS1}$ during the normal operation (see FIG. 12A). Then, when the video signal voltage $V_{Sig}$ from the data line $DTL_n$ is written into the capacitor $C_S$ via the write transistor $TR_W$, the drain current $I_{DS}$ flows in the drive transistor $TR_D$, and the light emitting unit OLED emits light (see FIG. 12B).

As described above, in the first embodiment, after the voltage of the other source/drain region of the drive transistor is set in such a manner that a difference between the voltage of the other source/drain region of the drive transistor and the drive voltage is decreased, the drive voltage is applied to the one source/drain region of the drive transistor. Thus, an overvoltage breakdown of the transistor used for the display element can be prevented. Specifically, a voltage higher than that to a single-color light emitting unit OLED needs to be applied to cause a light emitting unit OLED having a structure in which a plurality of light emitting layers is stacked to operate. Even in such a case, an overvoltage breakdown of the transistor can be suitably prevented.

Modification Example of First Embodiment

Next, a modification example of the first embodiment will be described. The modification example of the first embodiment also relates to a display device, a driving method for the display device, and electronic equipment according to the present disclosure.

Figure 13:
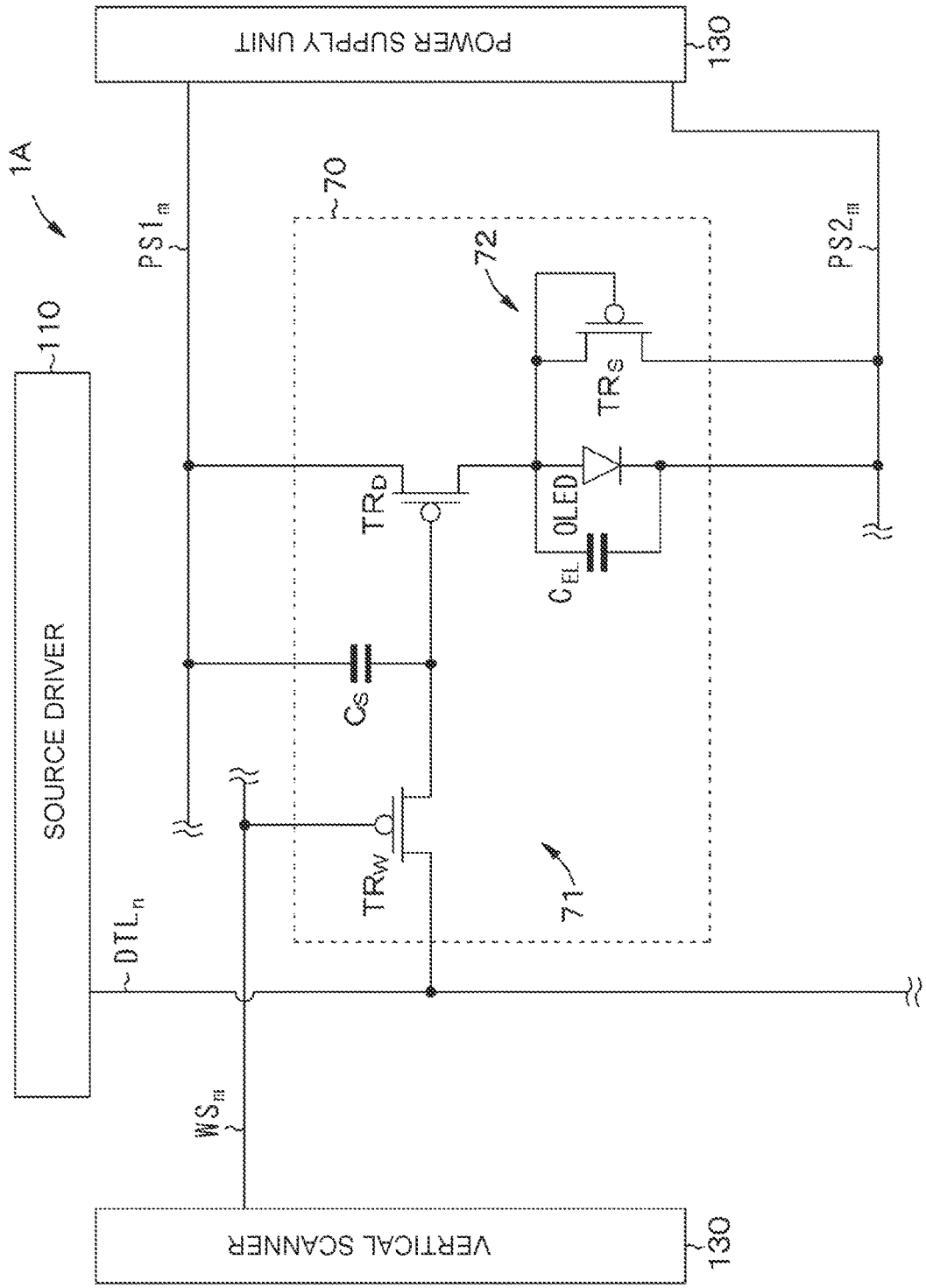
FIG. 13 is a schematic circuit diagram of a display element (pixel) including a light emitting unit and a drive circuit to drive the light emitting unit in a display device according to a modification example of the first embodiment.

FIG. 13 is a schematic circuit diagram of a display element (pixel) including a light emitting unit and a drive circuit to drive the light emitting unit in the display device according to the modification example of the first embodiment. In a conceptual diagram of the display device according to the modification example of the first embodiment, the display device 1 in FIG. 1 is replaced with a display device 1A.

The display device 1A illustrated in FIG. 13 is different from the display device 1 illustrated in FIG. 4 in a point that a cathode electrode side of a light emitting unit OLED is also connected to a second feeder line PS2.

FIG. 14A to FIG. 16B are schematic circuit diagrams for describing transition of the display device 1A according to the modification example of the first embodiment from an operating state to a non-operating state, and re-activation to the operating state. Note that operation of one pixel 70, more specifically, an (n, m)-th pixel 70 is illustrated, for convenience of description.

Figure 14A:
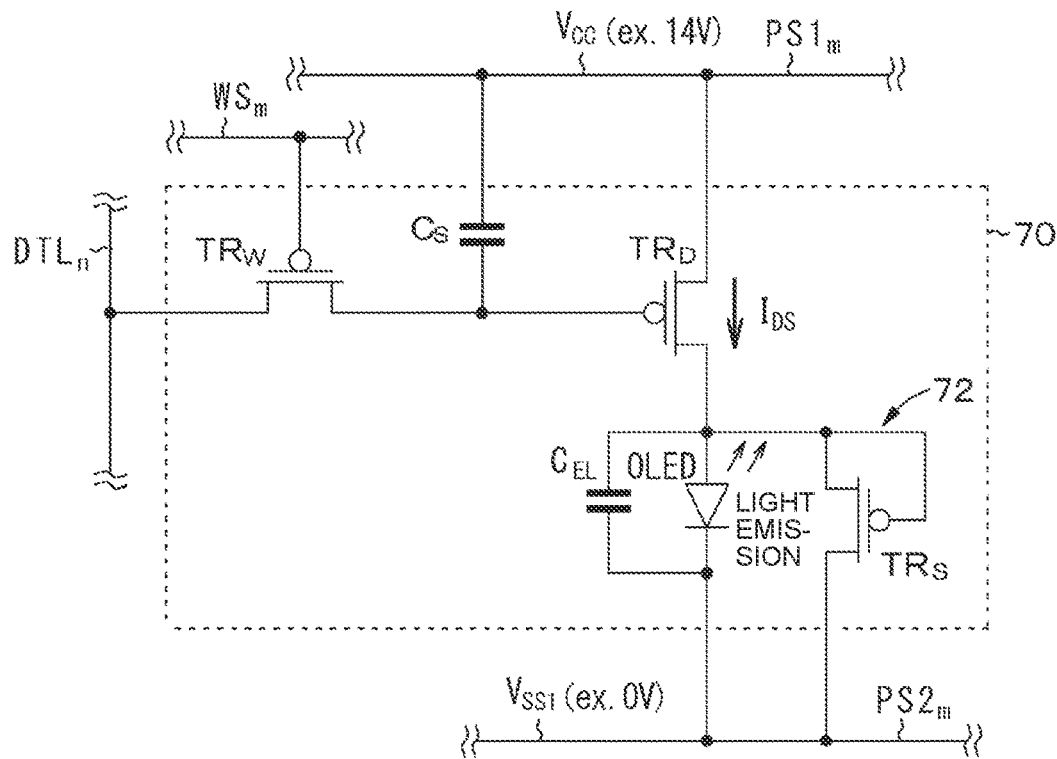
FIG. 14A is a schematic circuit diagram for describing an operating state of the display element of when the display device according to the modification example is in an operating state.

FIG. 14A is a view corresponding to FIG. 5A described above. Since a drive voltage $V_{CC}$ is applied from a first feeder line PS1, to one source/drain region of a drive transistor $TR_D$ and $V_gS$ is held at [−2 V] by a capacitor $C_S$, a drain current $I_{DS}$ corresponding to white display can be made to flow in a light emitting unit OLED. A voltage $V_{SS1}$ (such as ground potential) is applied to a second feeder line $PS2_m$.

Figure 14B:
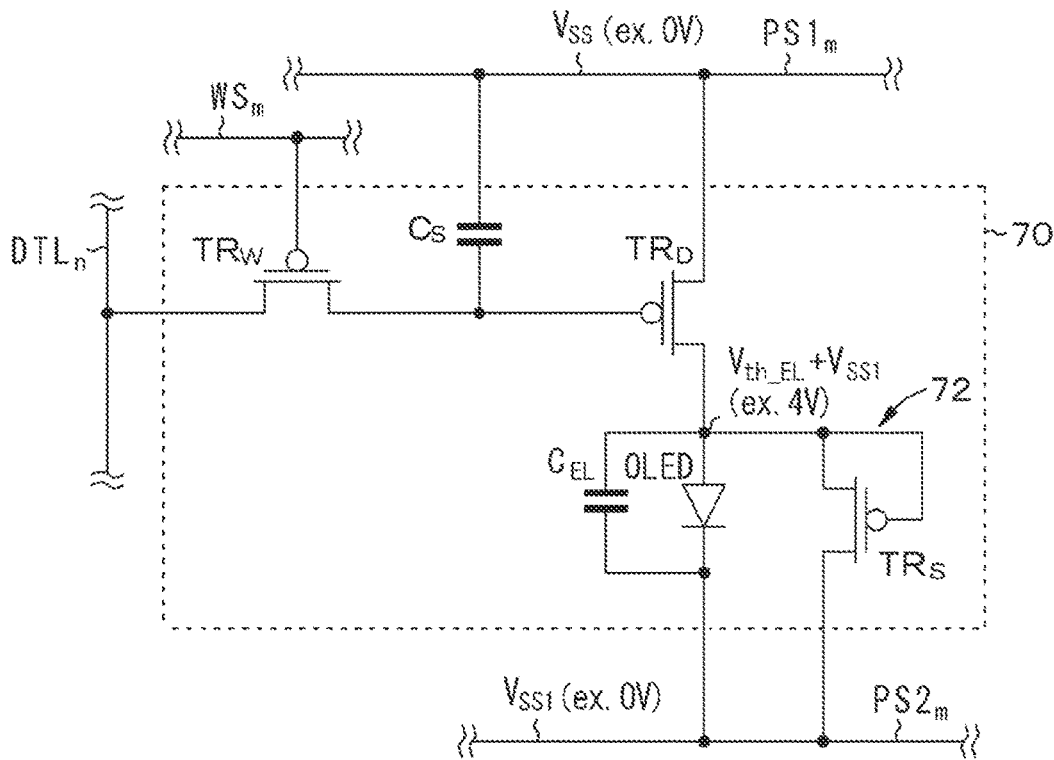
FIG. 14B is a schematic circuit diagram for describing a state of the display element of when the display device according to the modification example is switched from the operating state to a non-operating state, following FIG. 14A.

Next, a state in which the display device 1A transitions to the non-operating state will be described with reference to FIG. 14B, FIG. 15A, and FIG. 15B.

When the display device 1A is turned off and becomes the non-operating state, a voltage of the first feeder line PS1, becomes, for example, $V_{SS}$ that is the ground potential. The voltage of the second feeder line $PS2_m$ is $V_{SS1}$. A voltage of an anode electrode of the light emitting unit OLED and the other source/drain region of the drive transistor $TR_D$ connected thereto becomes $[V_{th\_EL}+V_{SS1}]$ (see FIG. 14B).

Figure 15A:
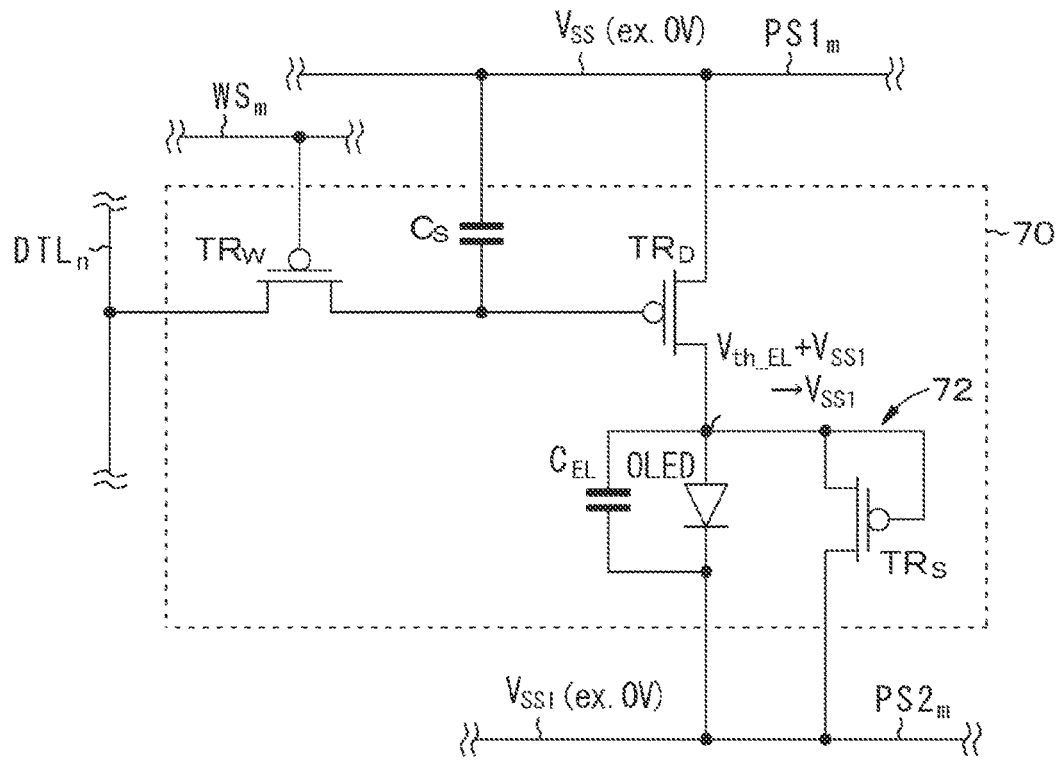
FIG. 15A is a schematic circuit diagram for describing the state of the display element of when time elapses after the display device according to the modification example is switched to the non-operating state, following FIG. 14B.
Figure 15B:
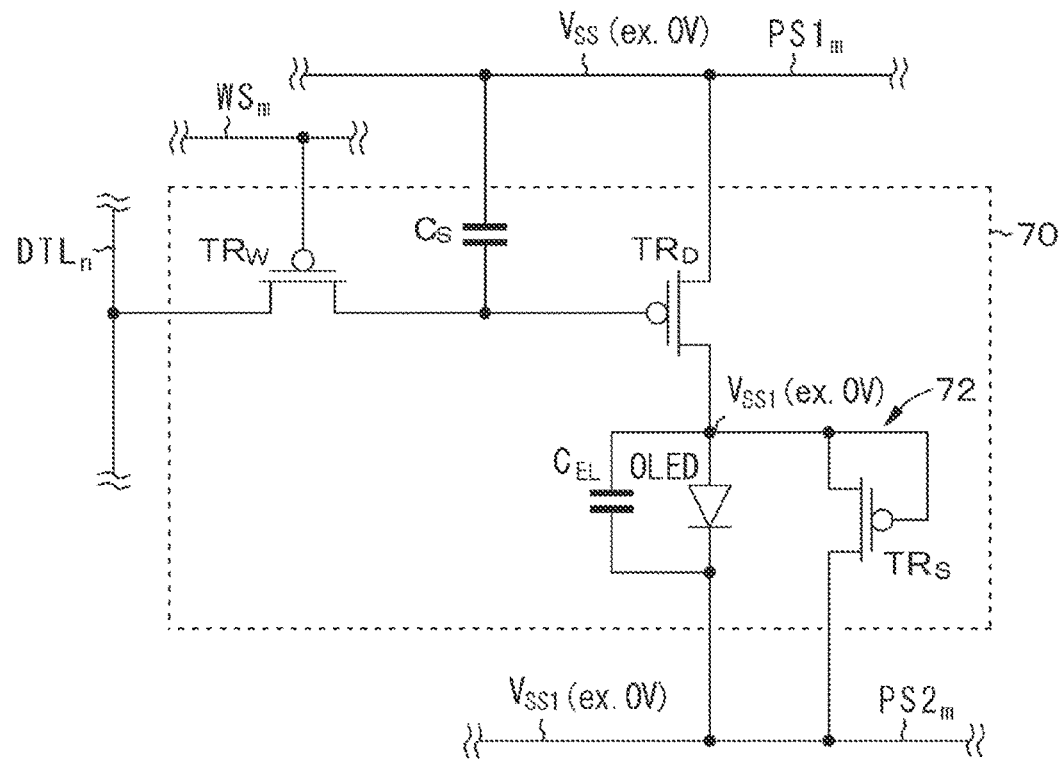
FIG. 15B is a schematic circuit diagram for describing the state of the display element of when time sufficiently elapses after the display device according to the modification example is switched to the non-operating state, following FIG. 15A.

As the non-operating state continues, a charge held in capacitance $C_{EL}$ of the light emitting unit OLED flows out, and the voltage of the anode electrode of the light emitting unit OLED changes to $V_{SS1}$ (see FIG. 15A). When sufficient time elapses, the voltage of the anode electrode of the light emitting unit OLED becomes $V_{SS1}$ (see FIG. 15B).

Figure 12B:
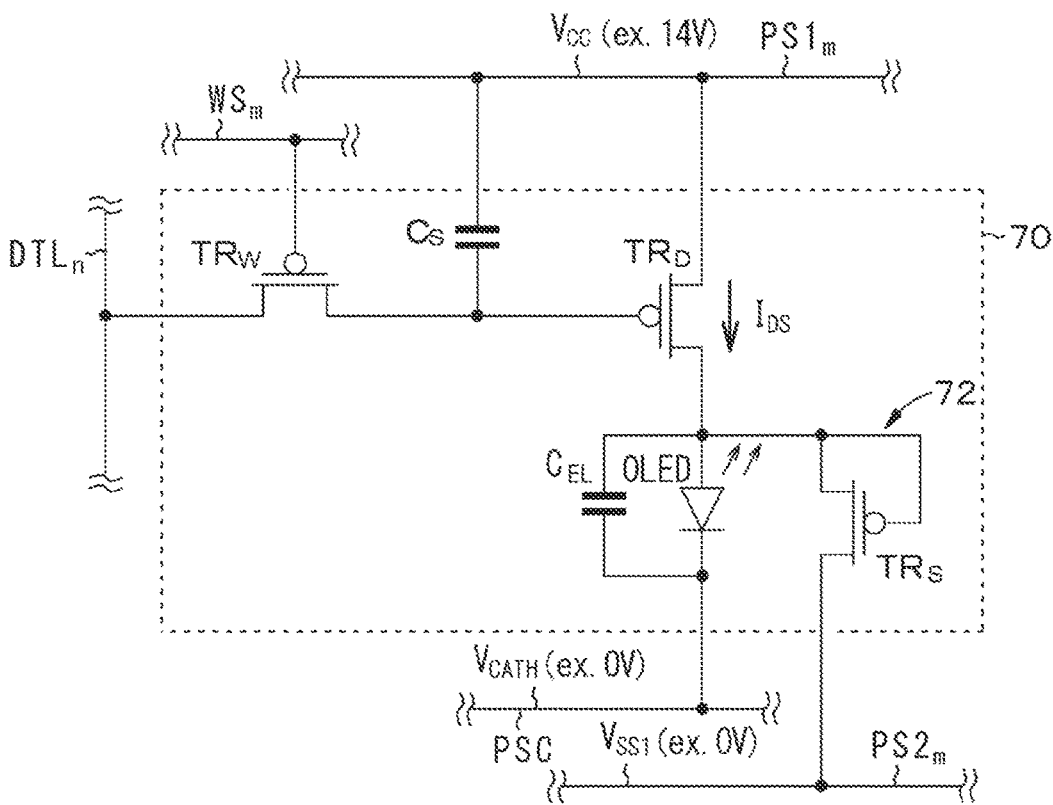
FIG. 12B is a schematic circuit diagram for describing the state of the display element at the time of the activation in the display device according to the first embodiment, following FIG. 12A.
Figure 16A:
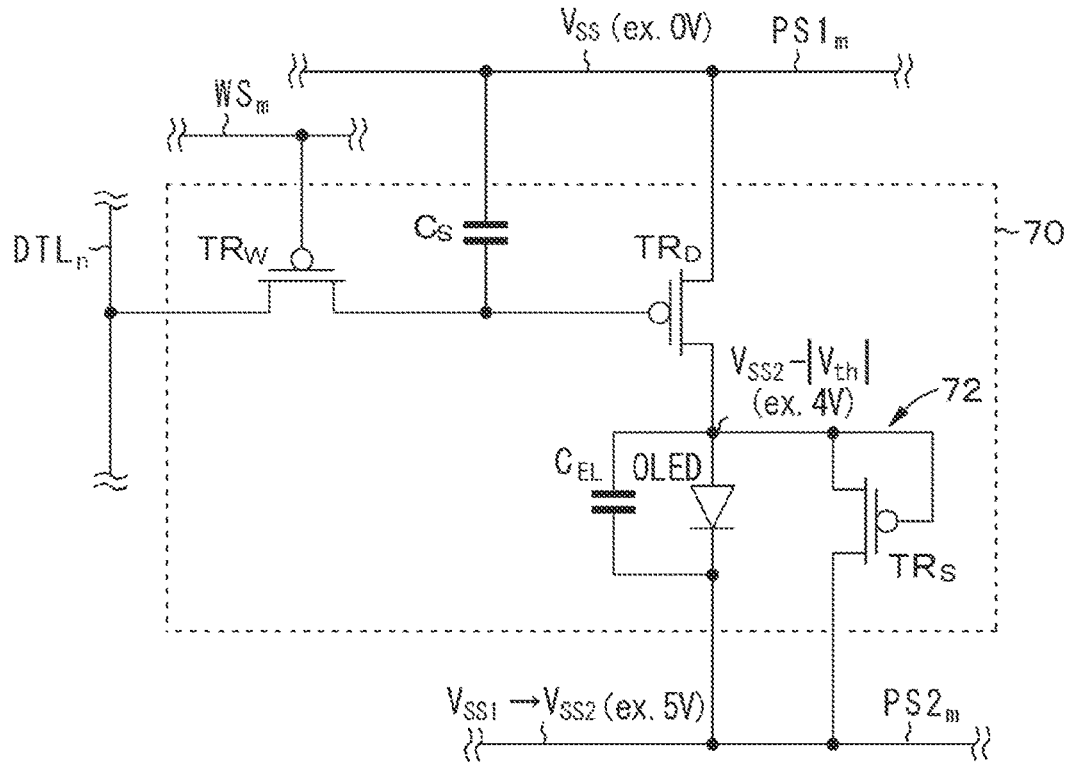
FIG. 16A is a schematic circuit diagram for describing the state of the display element at the time of activation in the display device according to the modification example, following FIG. 15B.
Figure 16B:
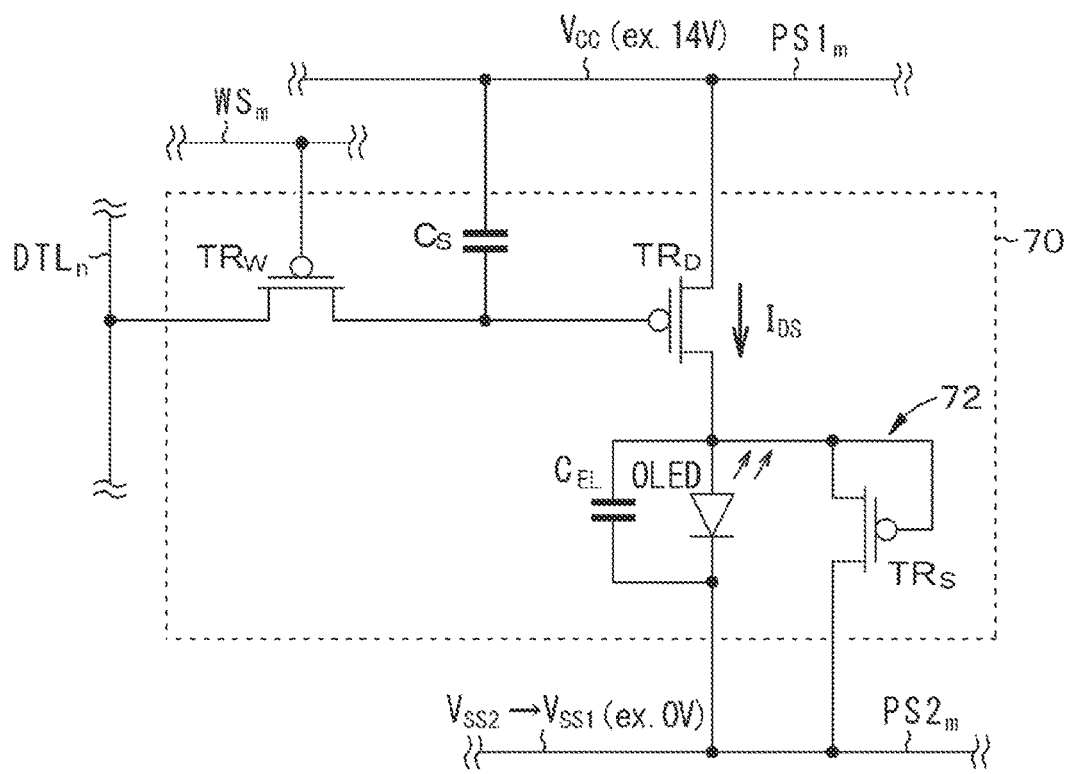
FIG. 16B is a schematic circuit diagram for describing the state of the display element at the time of the activation in the display device according to the modification example, following FIG. 16A.

Subsequently, a state of when the display device 1A is activated will be described with reference to FIG. 16A and FIG. 12B. Note that a threshold voltage of a transistor $TR_S$ is also indicated as a reference sign $V_{th}$, for convenience of description.

In a u display device 1A, voltage is applied to the other end of the diode-connected transistor $TR_S$, whereby the voltage of the other source/drain region of the drive transistor is set. More specifically, for example, at the time of activation of the display device 1A, a voltage $V_{SS2}$ (such as 5 V) higher than the voltage $V_{SS1}$ during normal operation is supplied to the second feeder line $PS2_m$ connected to the other end of the transistor $TR_S$ (see FIG. 16A).

Since the transistor $TR_S$ is diode-connected, the voltage of the anode electrode of the light emitting unit OLED changes from $V_{S1}$ toward $[V_{SS2}-|V_{th}|]$, and the voltage of the anode electrode of the light emitting unit OLED finally becomes $[V_{SS2}-|V_{th}|]$.

Then, the drive voltage $V_{CC}$ is applied from the first feeder line $PS1_m$ to the one source/drain region of the drive transistor $TR_D$. In addition, the voltage of the second feeder line PS2$_f$ is switched from V$_{SS21}$ to V$_{SS1}$. Then, when a video signal voltage V$_{Sig}$ from a data line DTL$_n$ is written into the capacitor C$_S$ via the write transistor TR$_W$, the drain current I$_{DS}$ flows in the drive transistor TR$_D$, and the light emitting unit OLED emits light (see FIG. 16B).

Similarly to the display device 1, in the display device 1A, even when a voltage exceeding the design value is applied to the display element, an overvoltage breakdown of the transistor used for the display element can be prevented. In addition, since the common feeder line PSC can be omitted, a cost of the display device can be reduced.

Second Embodiment

The second embodiment also relates to a display device, a driving method for the display device, and electronic equipment according to the present disclosure.

Figure 17:
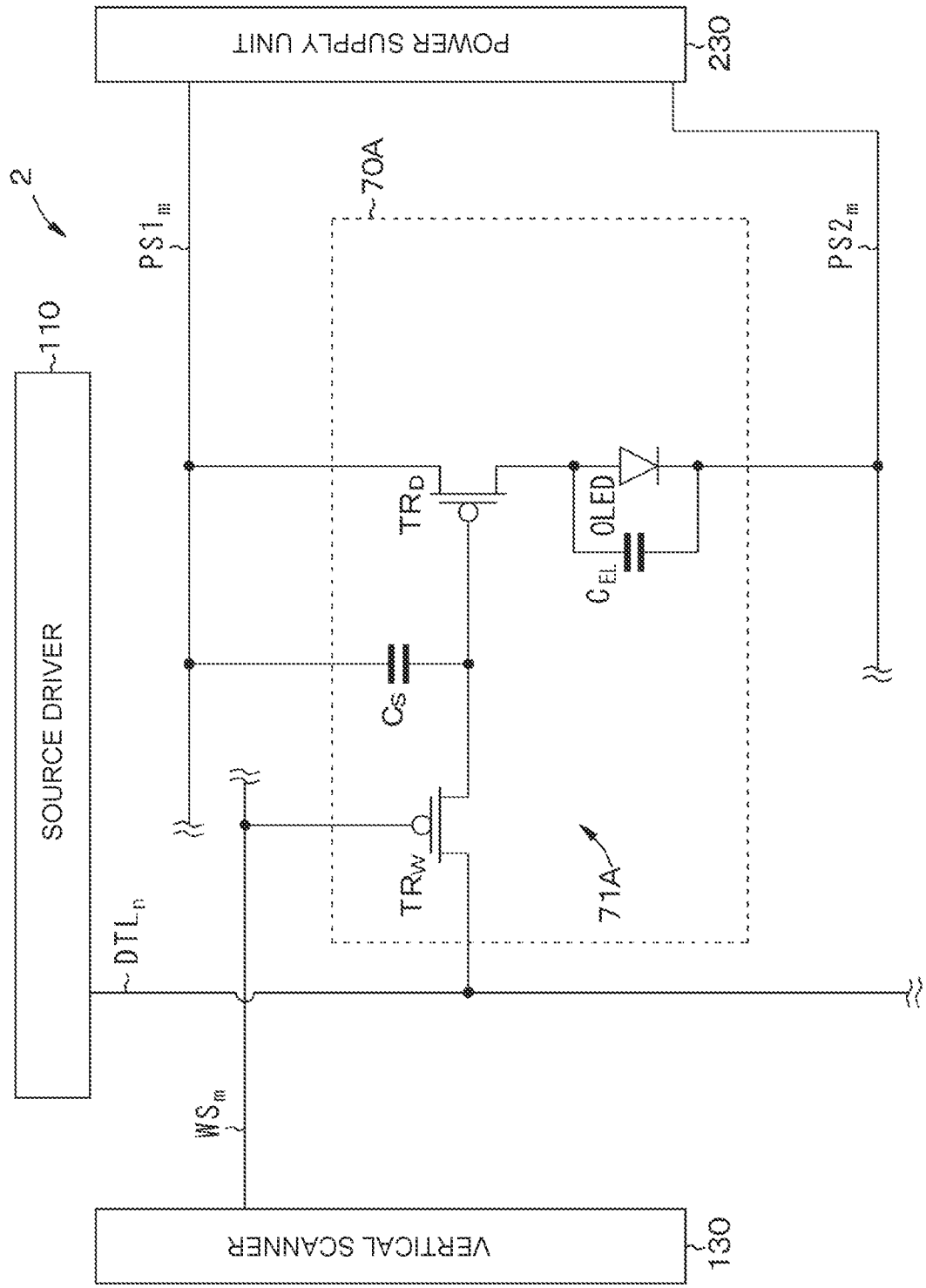
FIG. 17 is a schematic circuit diagram of a display element (pixel) including a light emitting unit and a drive circuit to drive the light emitting unit in a display device according to a second embodiment.

FIG. 17 is a schematic circuit diagram of a display element (pixel) including a light emitting unit and a drive circuit to drive the light emitting unit in the display device according to the second embodiment. In a conceptual diagram of a display device according to a modification example of the second embodiment, the pixel 70 is replaced with a pixel 70A and the display device 1 is replaced with a display device 2 in FIG. 1.

Since the configuration of the pixel 70A is similar to the configuration described in the display device 1A of the reference example described with reference to FIG. 4, description thereof is omitted.

In the first embodiment, the voltage of the other source/drain region of the drive transistor is set by the voltage setting circuit connected to the other source/drain region of the drive transistor. On the other hand, in the second embodiment, the other end of the light emitting unit is connected to a second feeder line, and a voltage of the other source/drain region of a drive transistor is set when a voltage higher than a voltage during normal operation is supplied to the second feeder line.

FIG. 18A to FIG. 20B are schematic circuit diagrams for describing transition of a display device 2 according to the second embodiment from an operating state to a non-operating state, and re-activation to the operating state. Note that operation of one pixel 70A, more specifically, an (n, m)-th pixel 70A is illustrated, for convenience of description.

Figure 18A:
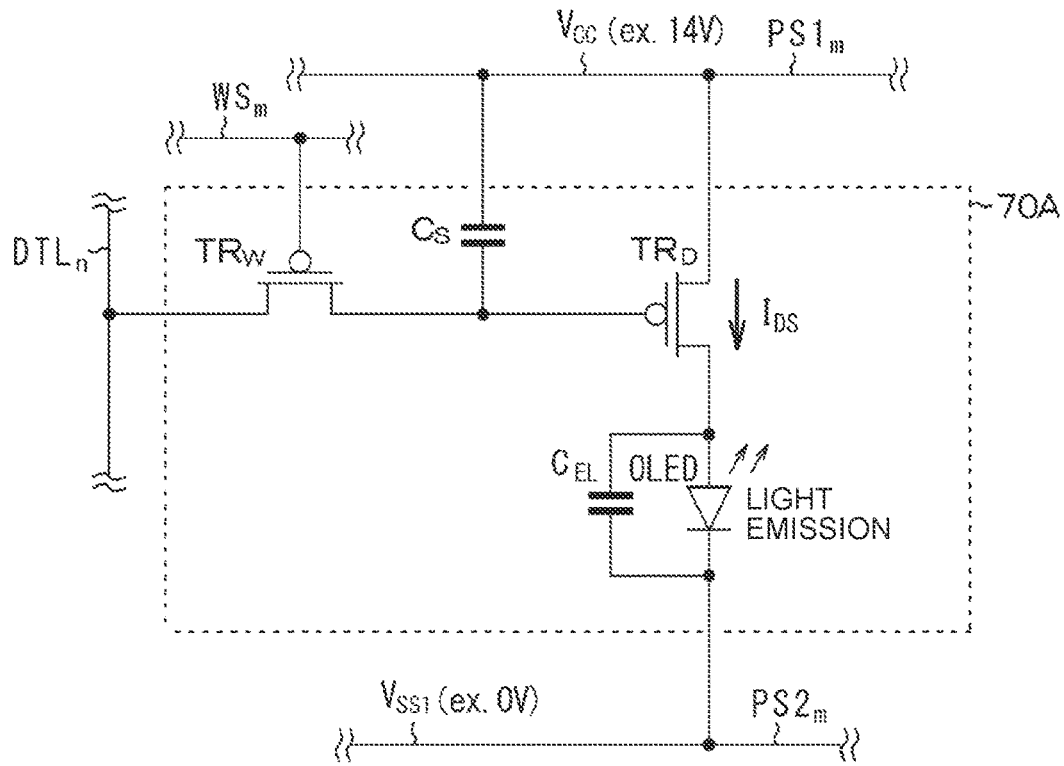
FIG. 18A is a schematic circuit diagram for describing an operating state of the display element of when the display device according to the second embodiment is in an operating state.

FIG. 18A is a view corresponding to FIG. 5A described above. Since drive voltage V$_{CC}$ is applied from a first feeder line PS1$_m$ to one source/drain region of a drive transistor TR$_D$ and V$_{gs}$ is held at [−2 V] by a capacitor C$_S$, a drain current I$_L$s corresponding to white display can be made to flow in a light emitting unit OLED. A voltage V$_{SS1}$ (such as ground potential) is applied to a second feeder line PS2$_m$.

Figure 18B:
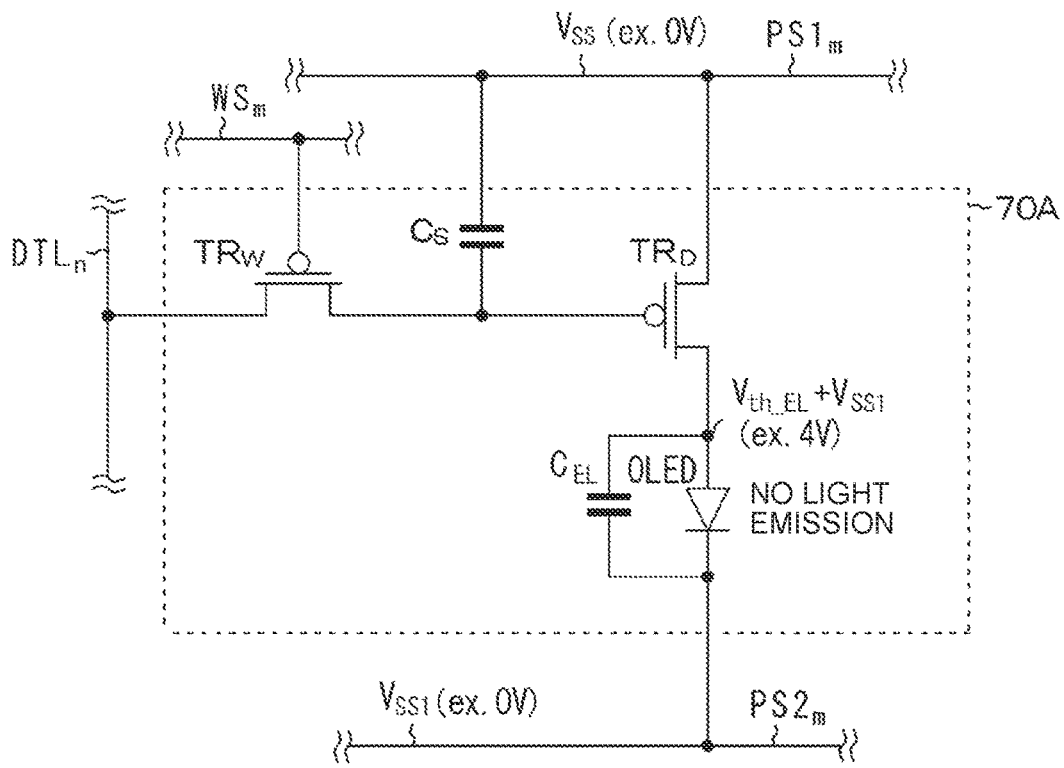
FIG. 18B is a schematic circuit diagram for describing a state of the display element of when the display device according to the second embodiment is switched from the operating state to a non-operating state, following FIG. 18A.
Figure 19A:
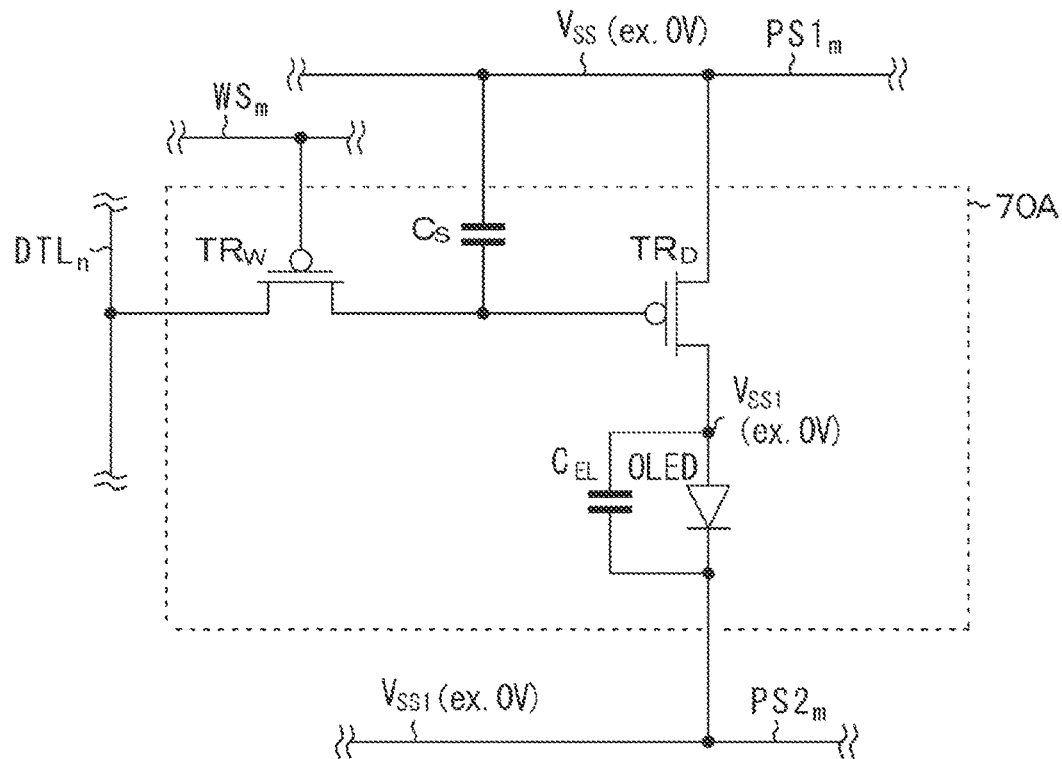
FIG. 19A is a schematic circuit diagram for describing the state of the display element of when time sufficiently elapses after the display device according to the second embodiment is switched to the non-operating state, following FIG. 18B.

Next, a state in which the display device 2 transitions to a non-operating state will be described with reference to FIG. 18B and FIG. 19A.

When the display device 2 is turned off and becomes the non-operating state, the voltage of the first feeder line PS1$_m$ becomes, for example, Vs; that is the ground potential. The voltage of the second feeder line PS2$_m$ is V$_{SS1}$. A voltage of an anode electrode of the light emitting unit OLED and the other source/drain region of the drive transistor TR$_D$ connected thereto becomes [V$_{th\_EL}$+V$_{SS1}$] (see FIG. 18B).

As the non-operating state continues, a charge held in capacitance C$_{EL}$ of the light emitting unit OLED flows out, and the voltage of the anode electrode of the light emitting unit OLED changes toward V$_{SS1}$. When sufficient time elapses, the voltage of the anode electrode of the light emitting unit OLED becomes V$_{SS1}$ (see FIG. 19A).

Subsequently, a state of when the display device 2 is activated will be described with reference to FIG. 19B to FIG. 20B.

Figure 19B:
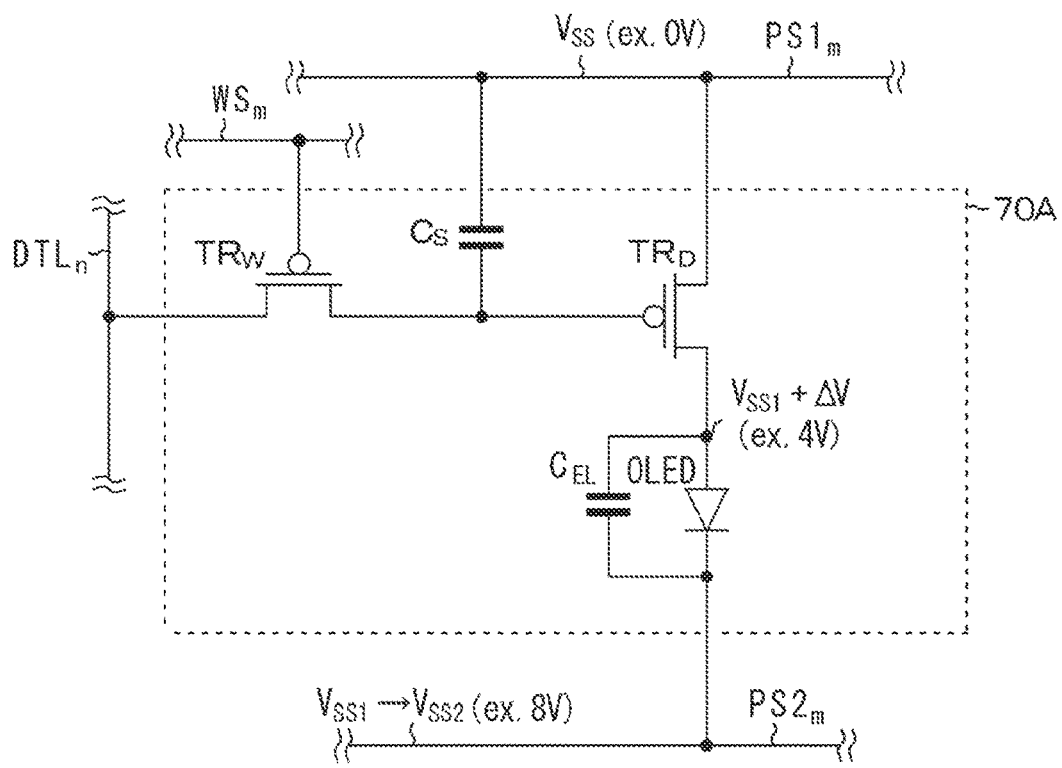
FIG. 19B is a schematic circuit diagram for describing the state of the display element at the time of activation in the display device according to the second embodiment, following FIG. 19A.

For example, at the time of activation of the display device 2, a voltage V$_{SS2}$ (such as 8 V) higher than the voltage V$_{SS1}$ during the normal operation is supplied to the second feeder line PS2$_m$ (see FIG. 19B). Since the voltage of the second feeder line PS2$_m$ changes from V$_{SS1}$ to V$_{SS2}$, the voltage of the other source/drain region of the drive transistor TR$_D$ is increased due to coupling between the capacitance C$_{EL}$ of the light emitting unit OLED and the capacitor C$_S$, and the like. When an increase amount is expressed as ΔV, the voltage of the other source/drain region of the drive transistor TR$_D$ becomes [V$_{SS1}$+ΔV]. When it is assumed that approximately half of the voltage change of the second feeder line PS2$_m$ is ΔV, [V$_{SS1}$+ΔV] is about 4 V. In such a manner, the voltage of the other source/drain region of the drive transistor TR$_D$ is set when a voltage higher than the voltage during the normal operation is supplied to the second feeder line PS2$_m$. The voltage V$_{SS2}$ is appropriately set according to specifications or the like of the display element in such a manner that a voltage of about V$_{th\_EL}$ is acquired as ΔV.

Then, the drive voltage V$_{CC}$ is applied from the first feeder line PS1$_m$ to the one source/drain region of the drive transistor TR$_D$. At this time, it is assumed that a high voltage exceeding a design value [V$_{CC}$+ΔV] is instantaneously supplied from the first feeder line PS1$_m$ and then transitions to the drive voltage [V$_{CC}$] (see FIG. 20A).

Figure 20A:
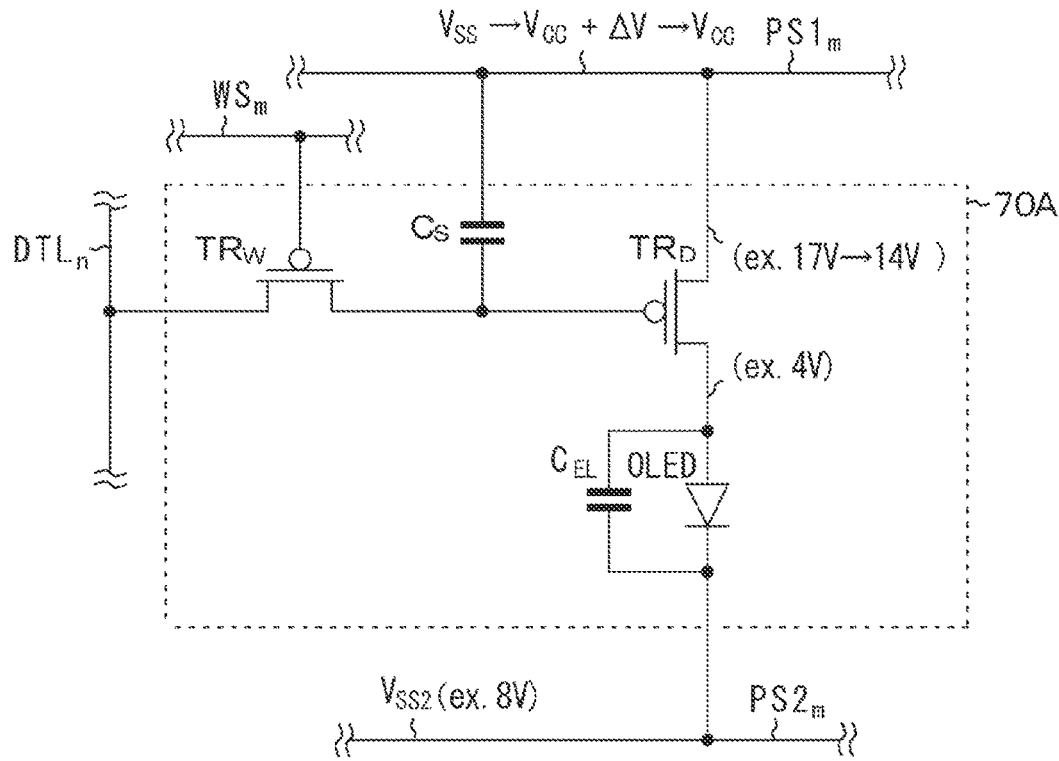
FIG. 20A is a schematic circuit diagram for describing the state of the display element at the time of the activation in the display device according to the second embodiment, following FIG. 19B.

In this case, as illustrated in FIG. 20A, the voltage of the one source/drain region of the drive transistor TR$_D$ transitions from 17 V to 14 V. However, the voltage of the anode electrode of the light emitting unit OLED is set to about 4 V. Thus, a voltage exceeding the design withstand voltage of 16 V is not applied to the drive transistor TR$_D$. This can avoid causing an overvoltage breakdown of the transistor.

Figure 20B:
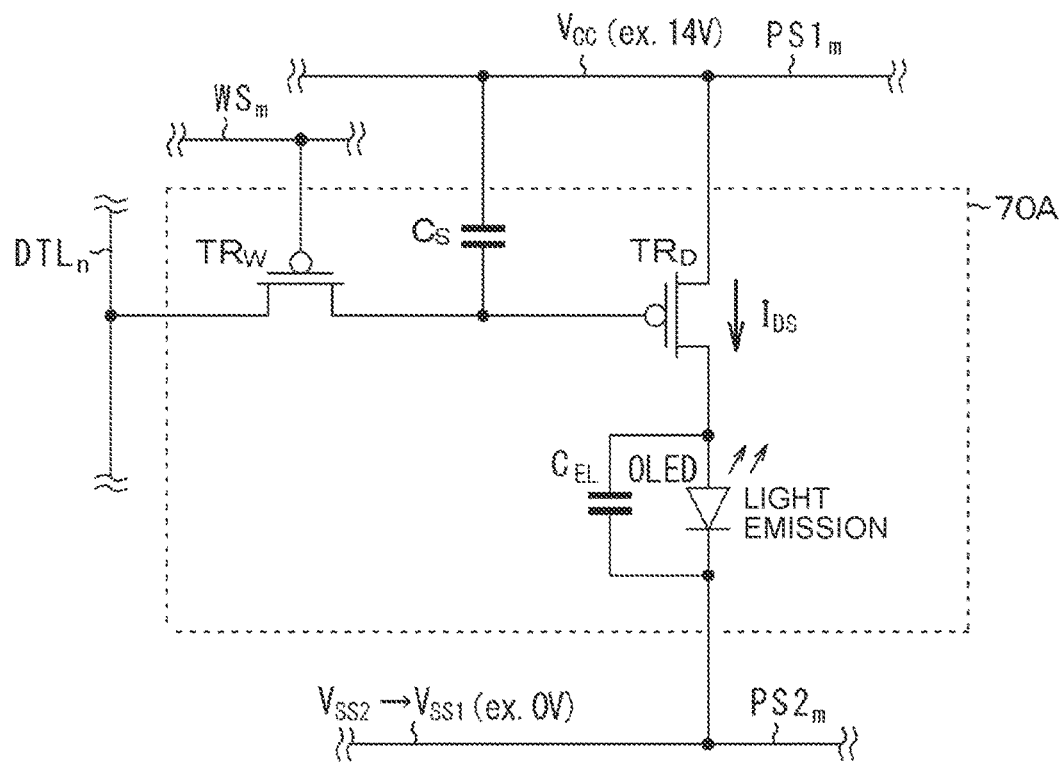
FIG. 20B is a schematic circuit diagram for describing the state of the display element at the time of the activation in the display device according to the second embodiment, following FIG. 20A.

Subsequently, the voltage of the second feeder line PS2$_m$ is switched from V$_{SS2}$ to the voltage V$_{SS1}$ during the normal operation (see FIG. 20B). Then, when a video signal voltage V$_{Sig}$ from a data line DTL$_n$ is written into the capacitor C$_S$ via a write transistor TR$_W$, the drain current I$_{DS}$ flows in the drive transistor TR$_D$, and the light emitting unit OLED emits light.

As described above, in the second embodiment, after the voltage of the other source/drain region of the drive transistor is set in such a manner that a difference between the voltage of the other source/drain region of the drive transistor and the drive voltage is decreased, the drive voltage is applied to the one source/drain region of the drive transistor. Thus, an overvoltage breakdown of the transistor used for the display element can be prevented.

[Another Configuration Example of Display Element]

In the display element 70 in the first embodiment, the voltage setting circuit using the diode-connected transistor is connected to the other source/drain region of the drive transistor. However, the display element and the voltage setting circuit may have various modes.

For example, a voltage setting circuit may have a configuration in which a switching transistor connected to the other source/drain region of a drive transistor is included and a voltage for setting is applied to the other source/drain region of the drive transistor via the switching transistor brought into a conductive state.

Hereinafter, another configuration example of a display element will be described with reference to FIG. 21A to FIG. 23.

Figure 21A:
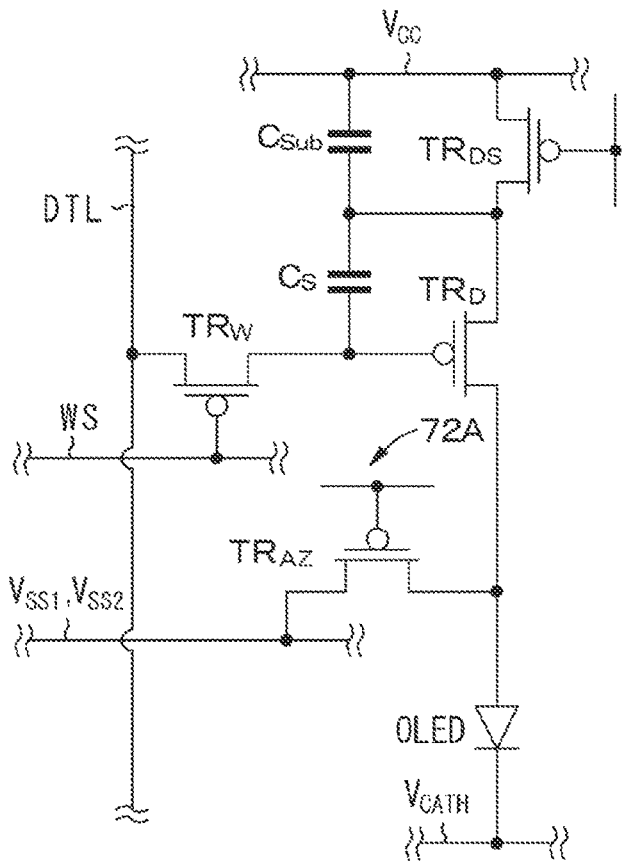
FIG. 21A is a schematic circuit diagram for describing a first modification example of the display element.

FIG. 21A is a schematic circuit diagram of a display element including four p-channel transistors and two capacitors. The other source/drain region of a drive transistor $TR_D$ and one end of a light emitting unit OLED are connected. This display element includes a voltage setting circuit 72A including a switching transistor $TR_{AZ}$ connected to the other source/drain region of the drive transistor $TR_D$. By selectively supplying a voltage $V_{SS1}$ to be normally applied and a voltage setting voltage $V_{SS2}$ via the transistor $TR_AZ$, it is possible to set a voltage of the other source/drain region of the drive transistor in such a manner that a difference between the voltage of the other source/drain region of the drive transistor and a drive voltage is decreased.

Figure 21B:
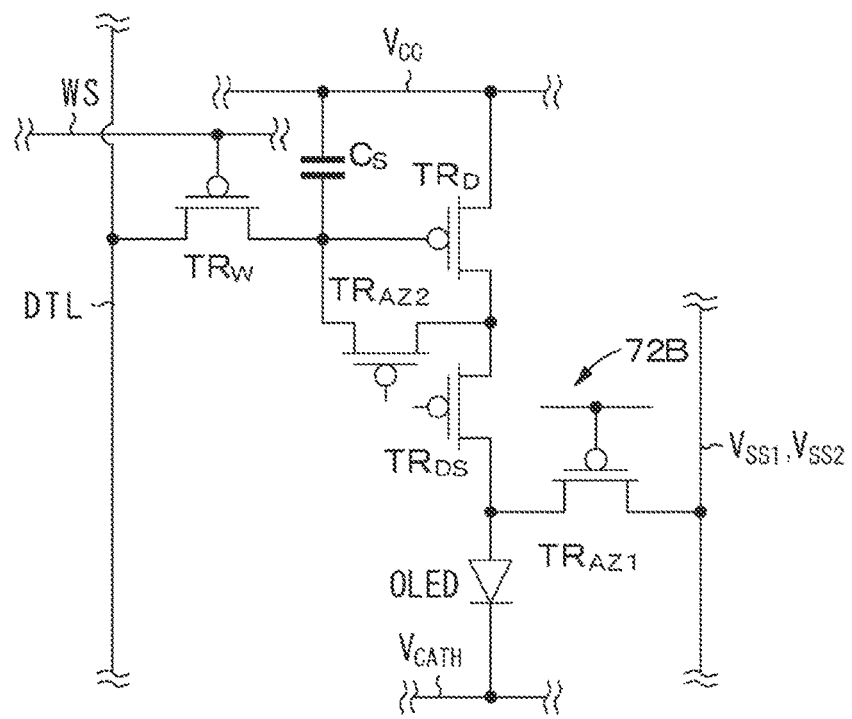
FIG. 21B is a schematic circuit diagram for describing a second modification example of the display element.

FIG. 21B is a schematic circuit diagram of a display element including five p-channel transistors and one capacitor. The other source/drain region of a drive transistor $TR_D$ and one end of a light emitting unit OLED are connected. This display element includes a voltage setting circuit 72B including a switching transistor $TR_{AZ1}$ connected to the other source/drain region of the drive transistor $TR_D$. The transistor $TR_{AZ1}$ is connected to the other source/drain region of the drive transistor $TR_D$. By selectively supplying a voltage $V_{SS1}$ to be normally applied and a voltage setting voltage $V_{SS2}$ via the transistor $TR_{AZ1}$, it is possible to set a voltage of the other source/drain region of the drive transistor in such a manner that a difference between the voltage of the other source/drain region of the drive transistor and a drive voltage is decreased.

Figure 22A:
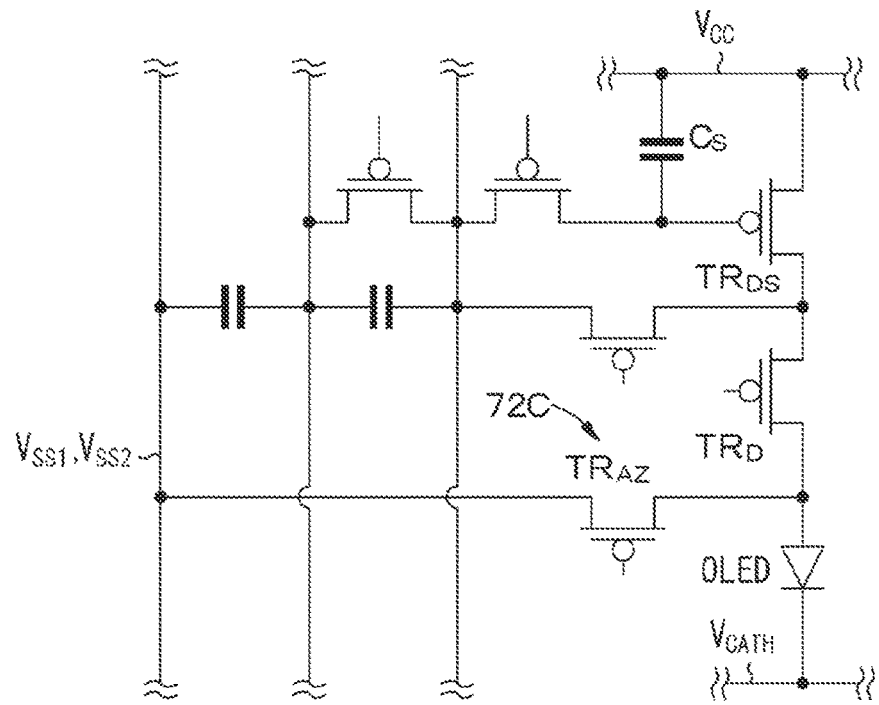
FIG. 22A is a schematic circuit diagram for describing a third modification example of the display element.

FIG. 22A is a schematic circuit diagram of a display element including six p-channel transistors and one capacitor. The other source/drain region of a drive transistor $TR_D$ and one end of a light emitting unit OLED are connected. This display element includes a voltage setting circuit 72C including a switching transistor $TR_{AZ}$ connected to the other source/drain region of the drive transistor $TR_D$. By selectively supplying a voltage $V_{SS1}$ to be normally applied and a voltage setting voltage $V_{SS2}$ via the transistor $TR_{AZ}$, it is possible to set a voltage of the other source/drain region of the drive transistor in such a manner that a difference between the voltage of the other source/drain region of the drive transistor and a drive voltage is decreased.

Figure 22B:
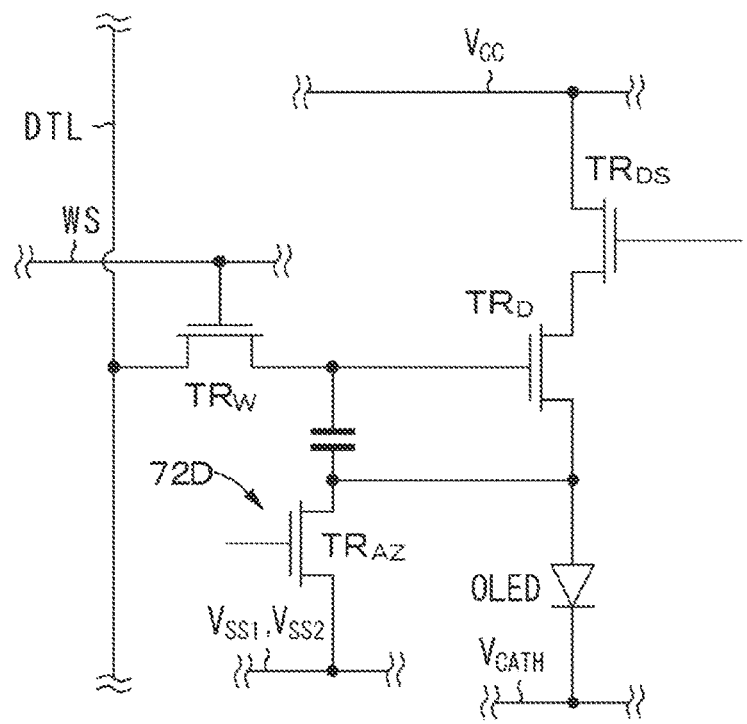
FIG. 22B is a schematic circuit diagram for describing a fourth modification example of the display element.

FIG. 22B is a schematic circuit diagram of a display element including four n-channel transistors and one capacitor. The other source/drain region of a drive transistor $TR_D$ and one end of a light emitting unit OLED are connected. This display element includes a voltage setting circuit 72D including a switching transistor $TR_{AZ}$ connected to the other source/drain region of the drive transistor $TR_D$. By selectively supplying a voltage $V_{SS1}$ to be normally applied and a voltage setting voltage $V_{SS2}$ via the transistor $TR_{AZ}$, it is possible to set a voltage of the other source/drain region of the drive transistor in such a manner that a difference between the voltage of the other source/drain region of the drive transistor and a drive voltage is decreased.

Figure 23:
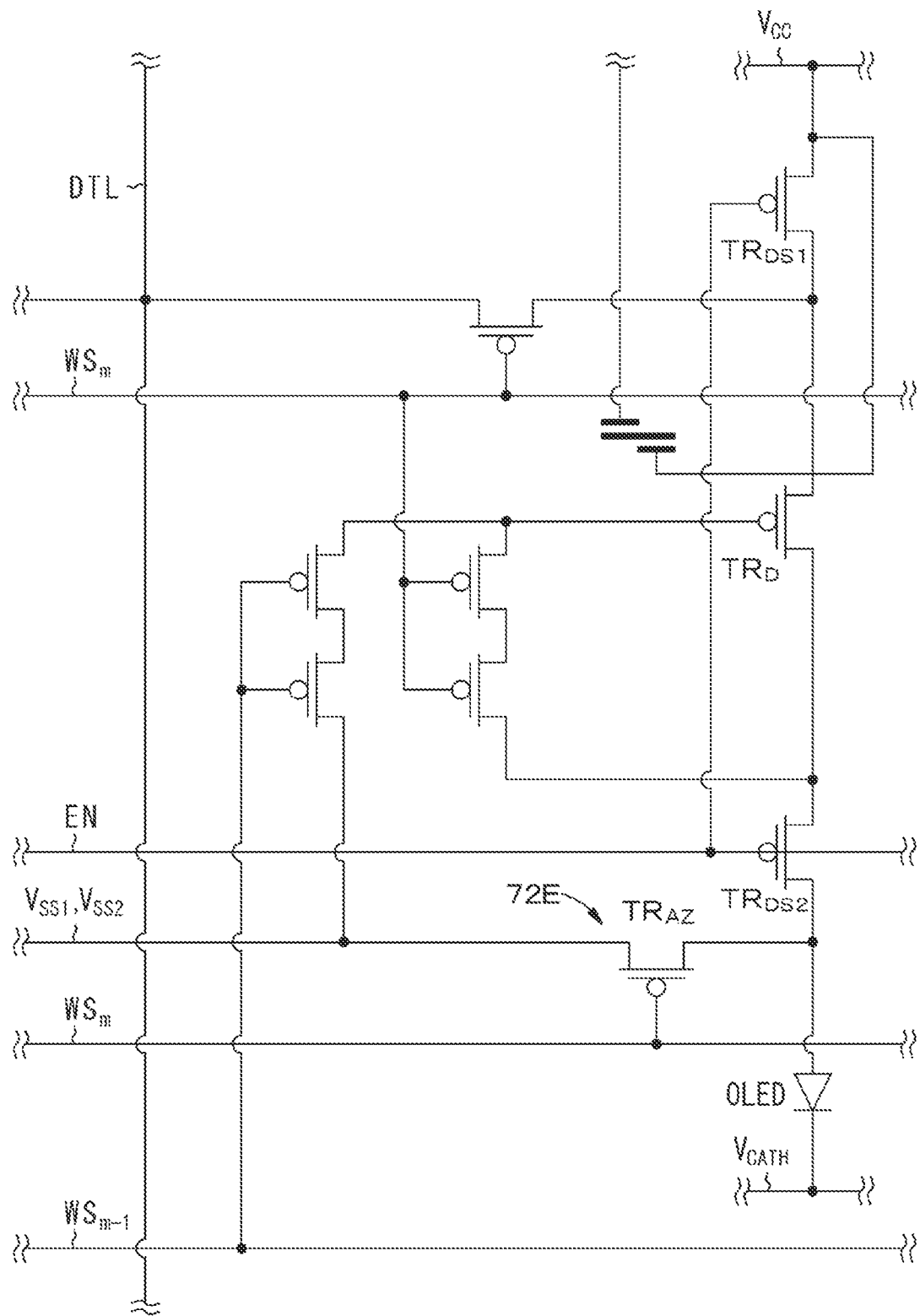
FIG. 23 is a schematic circuit diagram for describing a fifth modification example of the display element.

FIG. 23 is a schematic circuit diagram of a display element including nine p-channel transistors and one capacitor. The other source/drain region of the drive transistor $TR_D$ and one end of a light emitting unit OLED are connected via a transistor $TR_{DS}$. This display element includes a voltage setting circuit 72E including a switching transistor $TR_{AZ}$ connected to the other source/drain region of the drive transistor $TR_D$. By selectively supplying a voltage $V_{SS1}$ to be normally applied and a voltage setting voltage $V_{SS2}$ via the transistor $TR_{AZ}$, it is possible to set a voltage of the other source/drain region of the drive transistor in such a manner that a difference between the voltage of the other source/drain region of the drive transistor and a drive voltage is decreased.

Although the embodiments of the present disclosure have been specifically described above, the present disclosure is not limited to the above-described embodiments, and various modifications based on the technical idea of the present disclosure are possible. For example, the numerical values, structures, substrates, raw materials, processes, and the like mentioned in the above-described embodiments are merely examples, and numerical values, structures, substrates, raw materials, processes, and the like different therefrom may be used as needed.

The above-described display device of the present disclosure can be used as a display unit (display device) of electronic equipment in any field which unit displays a video signal input to the electronic equipment or a video signal generated in the electronic equipment as an image or a video. As an example, the display device can be used, for example, as a display unit of a television set, a digital still camera, a notebook personal computer, a mobile terminal device such as a mobile phone, a video camera, a head mounted display (head mounted display), or the like.

The display device of the present disclosure also includes what has a module shape of a sealed configuration. As an example, a display module formed by attaching of a facing portion of transparent glass or the like to a pixel array unit is applicable. Note that the display module may be provided with a circuit unit, a flexible printed circuit (FPC), or the like for inputting/outputting a signal and the like that are from the outside to the pixel array unit. Hereinafter, a digital still camera and a head mounted display will be exemplified as specific examples of the electronic equipment using the display device of the present disclosure. However, the specific examples exemplified herein are merely examples, and are not the limitations.

First Specific Example

Figure 24A:
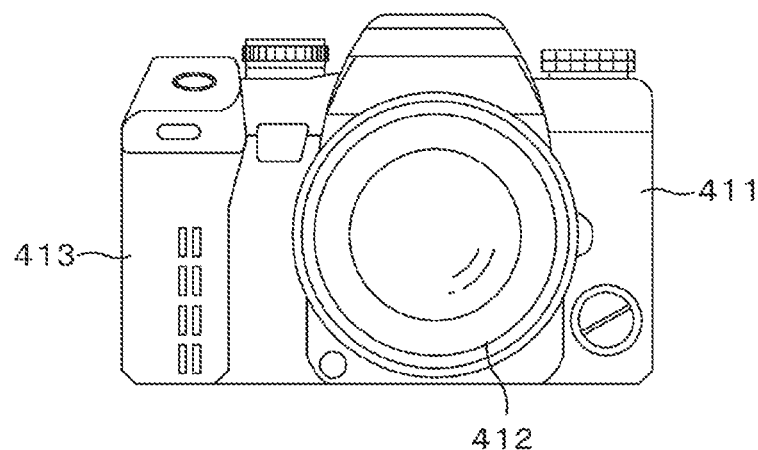
FIG. 24 is an external view of a lens-interchangeable single-lens reflex-type digital still camera, FIG. 24A being a front view thereof and FIG. 24B being a rear view thereof.
Figure 24B:
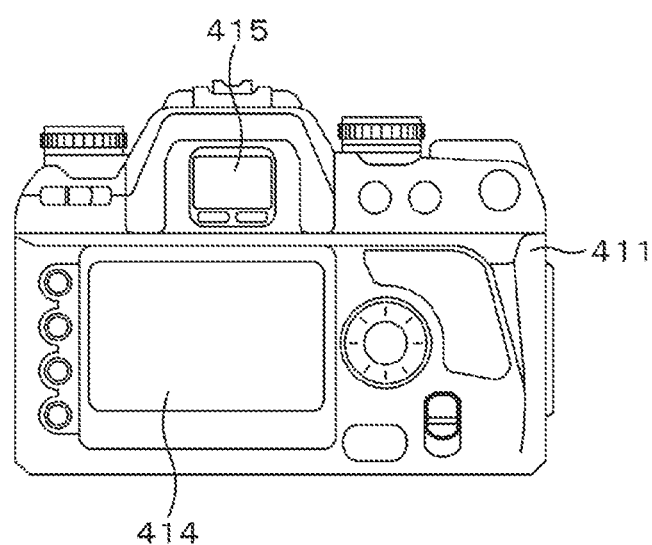

FIG. 24 is an external view of a lens-interchangeable single-lens reflex-type digital still camera, FIG. 24A being a front view thereof and FIG. 24B being a rear view thereof. The lens-interchangeable single-lens reflex-type digital still camera includes, for example, an interchangeable photographing lens unit (interchangeable lens) 412 on a front right side of a camera main body portion (camera body) 411, and a grip portion 413 to be held by a photographer on a front left side.

A monitor 414 is provided substantially at the center of a back surface of the camera main body portion 411. A viewfinder (eyepiece window) 415 is provided above the monitor 414. By looking into the viewfinder 415, the photographer can visually recognize an optical image of a subject guided from the photographing lens unit 412 and determine composition.

In the lens-interchangeable single-lens reflex-type digital still camera having the above configuration, the display device of the present disclosure can be used as the viewfinder 415. That is, the lens-interchangeable single-lens reflex-type digital still camera according to the present example is manufactured by utilization of the display device of the present disclosure as the viewfinder 415.

Second Specific Example

Figure 25:
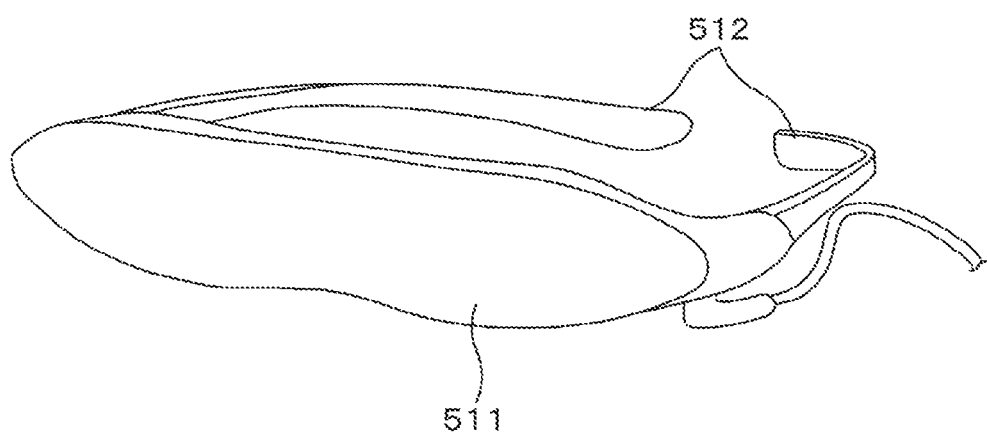
FIG. 25 is an external view of a head mounted display.

FIG. 25 is an external view of a head mounted display. The head mounted display has, respectively on both sides of an eyeglass-shaped display unit 511, ear hook portions 512 to be mounted on a head of a user, for example. In this head mounted display, the display device of the present disclosure can be used as the display unit 511. That is, the head mounted display according to the present example is manufactured by utilization of the display device of the present disclosure as the display unit 511.

Third Specific Example

Figure 26:
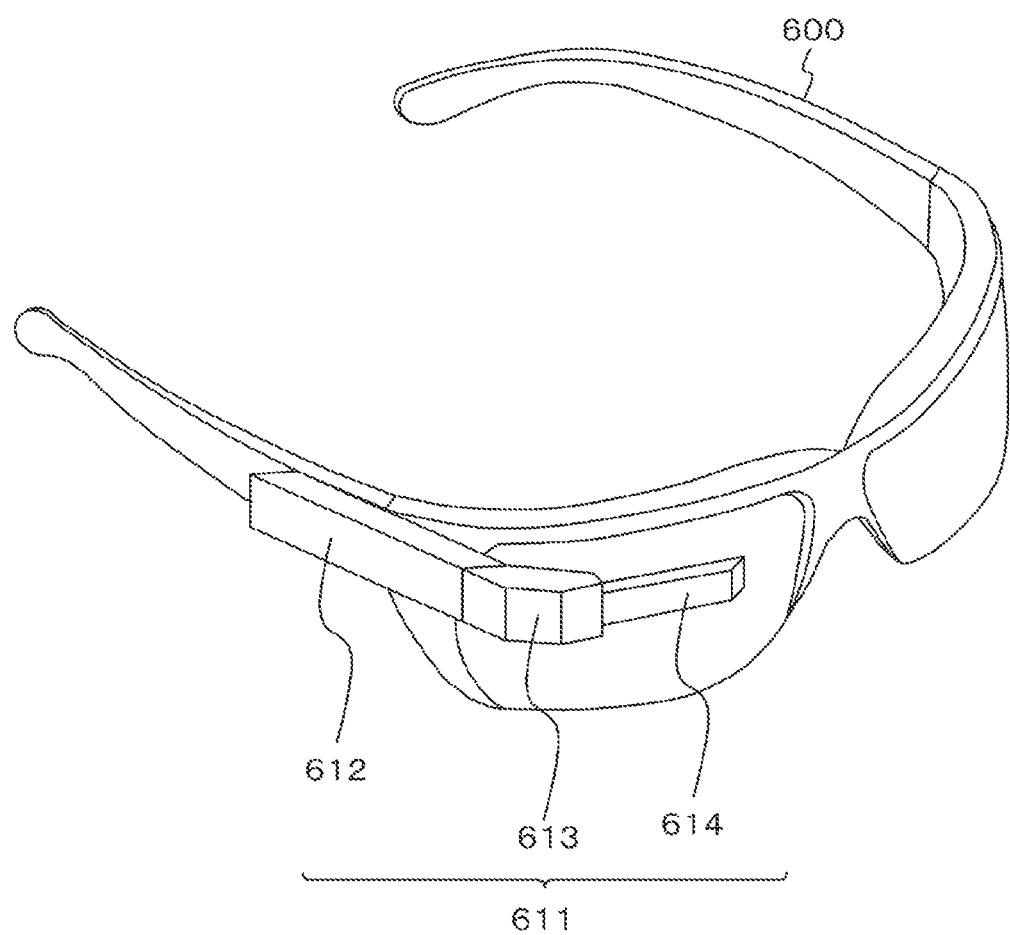
FIG. 26 is an external view of a see-through head mounted display.

FIG. 26 is an external view of a see-through head mounted display. A see-through head mounted display 611 includes a main body portion 612, an arm 613, and a lens barrel 614.

The main body portion 612 is connected to the arm 613 and glasses 600. Specifically, an end portion in a long side direction of the main body portion 612 is coupled to the arm 613, and one side of side surfaces of the main body portion 612 is coupled to the glasses 600 via a connecting member. Note that the main body portion 612 may be directly mounted on a head of a human body.

The main body portion 612 incorporates a control board for controlling an operation of the see-through head mounted display 611, and a display unit. The arm 613 connects the main body portion 612 and the lens barrel 614 and supports the lens barrel 614. Specifically, the arm 613 is coupled to each of the end portion of the main body portion 612 and an end portion of the lens barrel 614, and fixes the lens barrel 614. Furthermore, the arm 613 incorporates a signal line for performing communication of data related to an image provided from the main body portion 612 to the lens barrel 614.

The lens barrel 614 projects image light, which is provided from the main body portion 612 via the arm 613, through an eyepiece toward eyes of a user wearing the see-through head mounted display 611. In this see-through head mounted display 611, the display device of the present disclosure can be used for the display unit of the main body portion 612.

Note that the effects described in the present description are merely examples and are not limitations, and there may be another effect.

Note that the technology of the present disclosure can also have the following configurations.

[A1]
A display device in which display elements included in pixels are arrayed in a row direction and a column direction in a two-dimensional matrix, wherein
each of the display elements includes a current-driven light emitting unit and a drive circuit for driving the light emitting unit,
the drive circuit includes at least a drive transistor and a capacitor,
the drive transistor has one source/drain region to which a drive voltage is applied via a first feeder line and other source/drain region connected to one end of the light emitting unit, and is configured in such a manner that a current corresponding to a voltage held in the capacitor flows to the light emitting unit via the drive transistor, and
the drive voltage is applied to the one source/drain region of the drive transistor after a voltage of the other source/drain region of the drive transistor is set in such a manner that a difference between the voltage of the other source/drain region of the drive transistor and the drive voltage is decreased.

[A2]
The display device according to [A1], wherein
the voltage of the other source/drain region of the drive transistor is set by a voltage setting circuit connected to the other source/drain region of the drive transistor.

[A3]
The display device according to [A2], wherein
the voltage setting circuit includes a diode-connected transistor,
one end of the diode-connected transistor is connected to the other source/drain region of the drive transistor, and
the voltage of the other source/drain region of the drive transistor is set when voltage is applied to the other end of the diode-connected transistor.

[A4]
The display device according to [A3], wherein
the other end of the diode-connected transistor is connected to a second feeder line, and
a voltage higher than a voltage during normal operation is supplied to the second feeder line.

[A5]
The display device according to [A4], wherein
the other end of the light emitting unit is connected to a common feeder line independent of the second feeder line.

[A6]
The display device according to [A4], wherein
the other end of the light emitting unit is connected to the second feeder line.

[A7]
The display device according to [A2], wherein
a voltage setting circuit includes a switching transistor connected to the other source/drain region of the drive transistor, and
a voltage for setting is applied to the other source/drain region of the drive transistor via the switching transistor brought into a conductive state.

[A8]
The display device according to [A1], wherein
other end of the light emitting unit is connected to a second feeder line, and
the voltage of the other source/drain region of the drive transistor is set when a voltage higher than a voltage during normal operation is supplied to the second feeder line.

[A9]
The display device according to any one of [A1] to [A8], wherein
a voltage corresponding to a threshold voltage of the light emitting unit is set as the voltage of the other source/drain region of the drive transistor.

[A10]
The display device according to any one of [A1] to [A9], wherein
the light emitting unit includes an organic electroluminescence element.

[B1]
A driving method for a display device in which display elements included in pixels are arrayed in a row direction and a column direction in a two-dimensional matrix, wherein
each of the display elements includes a current-driven light emitting unit and a drive circuit for driving the light emitting unit,
the drive circuit includes at least a drive transistor and a capacitor, and
the drive transistor has one source/drain region to which a drive voltage is applied via a first feeder line and other source/drain region connected to one end of the light emitting unit, and is configured in such a manner that a current corresponding to a voltage held in the capacitor flows to the light emitting unit via the drive transistor, the driving method including:
a step of setting a voltage of the other source/drain region of the drive transistor in such a manner that a difference between the voltage of the other source/drain region of the drive transistor and the drive voltage is decreased; and a step of applying the drive voltage to the one source/drain region of the drive transistor thereafter, the steps being performed by utilization of the display device.

[B2]
The driving method for a display device according to [B1], further including
performing a step of setting a voltage of the other source/drain region of the drive transistor by a voltage setting circuit connected to the other source/drain region of the drive transistor.

[B3]
The driving method for a display device according to [B2], in which
the voltage setting circuit includes a diode-connected transistor,
one end of the diode-connected transistor is connected to the other source/drain region of the drive transistor, and
a step of setting the voltage of the other source/drain region of the drive transistor by applying a voltage to the other end of the diode-connected transistor is performed.

[B4]
The driving method for a display device according to [B3], in which
the other end of the diode-connected transistor is connected to a second feeder line, and
a voltage higher than a voltage during normal operation is supplied to the second feeder line.

[B5]
The driving method for a display device according to [B4], in which
the other end of the light emitting unit is connected to a common feeder line independent of the second feeder line.

[B6]
The driving method for a display device according to [B4], in which
the other end of the light emitting unit is connected to the second feeder line.

[B7]
The driving method for a display device according to [B2], in which
the voltage setting circuit includes a switching transistor connected to the other source/drain region of the drive transistor, and
a voltage for setting is applied to the other source/drain region of the drive transistor via the switching transistor brought into a conductive state.

[B8]
The driving method for a display device according to [B1], in which
the other end of the light emitting unit is connected to a second feeder line, and the voltage of the other source/drain region of the drive transistor is set when a voltage higher than a voltage during normal operation is supplied to the second feeder line.

[B9]
The driving method for a display device according to any one of [B1] to [B8], further including
setting a voltage corresponding to a threshold voltage of the light emitting unit as the voltage of the other source/drain region of the drive transistor.

[B10]
The driving method for a display device according to any one of [B1] to [B9], in which
the light emitting unit includes an organic electroluminescence element.

[C1]
Electronic equipment including:
a display device in which display elements included in pixels are arrayed in a row direction and a column direction in a two-dimensional matrix, wherein
each of the display elements includes a current-driven light emitting unit and a drive circuit for driving the light emitting unit,
the drive circuit includes at least a drive transistor and a capacitor,
the drive transistor has one source/drain region to which a drive voltage is applied via a first feeder line and other source/drain region connected to one end of the light emitting unit, and is configured in such a manner that a current corresponding to a voltage held in the capacitor flows to the light emitting unit via the drive transistor, and
the drive voltage is applied to the one source/drain region of the drive transistor after a voltage of the other source/drain region of the drive transistor is set in such a manner that a difference between the voltage of the other source/drain region of the drive transistor and the drive voltage is decreased.

[C2]
The electronic equipment according to [C1], in which
the voltage of the other source/drain region of the drive transistor is set by a voltage setting circuit connected to the other source/drain region of the drive transistor.

[C3]
The electronic equipment according to [C2], in which
the voltage setting circuit includes a diode-connected transistor, and
one end of the diode-connected transistor is connected to the other source/drain region of the drive transistor, and
the voltage of the other source/drain region of the drive transistor is set when voltage is applied to the other end of the diode-connected transistor.

[C4]
The electronic equipment according to [C3], in which
the other end of the diode-connected transistor is connected to a second feeder line, and
a voltage higher than a voltage during normal operation is supplied to the second feeder line.

[C5]
The electronic equipment according to [C4], in which
the other end of the light emitting unit is connected to a common feeder line independent of the second feeder line.

[C6]
The electronic equipment according to [C4], in which
the other end of the light emitting unit is connected to the second feeder line.

[C7]
The electronic equipment according to [C2], in which
the voltage setting circuit includes a switching transistor connected to the other source/drain region of the drive transistor, and
a voltage for setting is applied to the other source/drain region of the drive transistor via the switching transistor brought into a conductive state.

[C8]
The electronic equipment according to [C1], in which
the other end of the light emitting unit is connected to a second feeder line, and
the voltage of the other source/drain region of the drive transistor is set when a voltage higher than a voltage during normal operation is supplied to the second feeder line.

[C9]
The electronic equipment according to any one of [C1] to [C8], in which
a voltage corresponding to a threshold voltage of the light emitting unit is set as the voltage of the other source/drain region of the drive transistor.

[C10]
The electronic equipment according to any one of [C1] to [C9], in which
the light emitting unit includes an organic electroluminescence element.

REFERENCE SIGNS LIST 1, 1A, 2, 9 DISPLAY DEVICE
10 SUBSTRATE
20 SEMICONDUCTOR MATERIAL LAYER
21 n-CHANNEL WELL
22A ELEMENT ISOLATION REGION
23A ONE SOURCE/DRAIN REGION
23B OTHER SOURCE/DRAIN REGION
31 GATE INSULATING LAYER
31' INSULATING LAYER
32 GATE ELECTRODE
32' ELECTRODE
33 INTERLAYER INSULATING LAYER
34 ELECTRODE
35 CONTACT PLUG
36 CONTACT PLUG
38 WIRING LINE
40 INTERLAYER INSULATING LAYER
51 ANODE ELECTRODE
52 HOLE TRANSPORT LAYER, LIGHT EMITTING LAYER, AND ELECTRON TRANSPORT LAYER
53 CATHODE ELECTRODE
54 SECOND INTERLAYER INSULATING LAYER
55, 56 CONTACT HOLE
60 SUBSTRATE
70, 70A DISPLAY ELEMENT
71, 71A DRIVE CIRCUIT
72, 72A, 72B, 72C, 72D, 72E VOLTAGE SETTING CIRCUIT
80 PIXEL ARRAY UNIT
110 SOURCE DRIVER
120 VERTICAL SCANNER
130 POWER SUPPLY UNIT
WS SCANNING LINE
DTL DATA LINE
PS1 FIRST FEEDER LINE
PS2 SECOND FEEDER LINE
PSC COMMON FEEDER LINE
$TR_{WS}$ WRITE TRANSISTOR
$TR_D$ DRIVE TRANSISTOR
$TR_S$ DIODE-CONNECTED TRANSISTOR
$C_S$ CAPACITOR
OLED LIGHT EMITTING UNIT
$C_{EL}$ CAPACITANCE OF LIGHT EMITTING UNIT OLED
411 CAMERA MAIN BODY PORTION
412 PHOTOGRAPHING LENS UNIT
413 GRIP PORTION
414 MONITOR
415 VIEWFINDER
511 GLASSES-SHAPED DISPLAY UNIT
512 EAR HOOK PORTION
600 GLASSES
611 SEE-THROUGH HEAD MOUNTED DISPLAY
612 MAIN BODY PORTION
613 ARM
614 LENS BARREL

The invention claimed is:
1. A display device comprising:
display elements arrayed in a row direction and a column direction in a two-dimensional matrix, wherein
each of the display elements includes a current-driven light emitting unit and a drive circuit for driving the light emitting unit,
the drive circuit includes a drive transistor and a capacitor,
the drive transistor has a first source/drain region to which a drive voltage is applied via a first feeder line and a second source/drain region connected to a first end of the light emitting unit, and is configured in such a manner that a current corresponding to a voltage held in the capacitor flows to the light emitting unit via the drive transistor,
the drive voltage is applied to the first source/drain region of the drive transistor after a voltage of the second source/drain region of the drive transistor is set in such a manner that a difference between the voltage of the second source/drain region of the drive transistor and the drive voltage is decreased,
the voltage of the second source/drain region of the drive transistor is set by a voltage setting circuit connected to the second source/drain region of the drive transistor,
the voltage setting circuit includes a diode-connected transistor,
a first end of the diode-connected transistor is connected to the second source/drain region of the drive transistor,
the voltage of the second source/drain region of the drive transistor is set when voltage is applied to a second end of the diode-connected transistor,
the second end of the diode-connected transistor is connected to a second feeder line, and
a voltage higher than a voltage during normal operation is supplied to the second feeder line.

2. The display device according to claim 1, wherein a second end of the light emitting unit is connected to a common feeder line independent of the second feeder line.

3. The display device according to claim 1, wherein a second end of the light emitting unit is connected to the second feeder line.

4. The display device according to claim 1, wherein the light emitting unit includes an organic electroluminescence element.

5. Electronic equipment including the display device according to claim 1.

6. The electronic equipment according to claim 5, wherein a second end of the light emitting unit is connected to a common feeder line independent of the second feeder line.

7. The electronic equipment according to claim 5, wherein a second end of the light emitting unit is connected to the second feeder line.

8. The electronic equipment according to claim 5, wherein a voltage corresponding to a threshold voltage of the light emitting unit is set as the voltage of the second source/drain region of the drive transistor.

9. The electronic equipment according to claim 5, wherein the light emitting unit includes an organic electroluminescence element.

10. A display device comprising:
    display elements arrayed in a row direction and a column direction in a two-dimensional matrix, wherein
    each of the display elements includes a current-driven light emitting unit and a drive circuit for driving the light emitting unit,
    the drive circuit includes a drive transistor and a capacitor,
    the drive transistor has a first source/drain region to which a drive voltage is applied via a first feeder line and a second source/drain region connected to a first end of the light emitting unit, and is configured in such a manner that a current corresponding to a voltage held in the capacitor flows to the light emitting unit via the drive transistor,
    the drive voltage is applied to the first source/drain region of the drive transistor after a voltage of the second source/drain region of the drive transistor is set in such a manner that a difference between the voltage of the second source/drain region of the drive transistor and the drive voltage is decreased,
    a second end of the light emitting unit is connected to a second feeder line, and
    the voltage of the second source/drain region of the drive transistor is set when a voltage higher than a voltage during normal operation is supplied to the second feeder line.

11. The display device according to claim 1, wherein a voltage corresponding to a threshold voltage of the light emitting unit is set as the voltage of the second source/drain region of the drive transistor.

12. Electronic equipment including the display device according to claim 10.

13. A driving method for a display device including display elements arrayed in a row direction and a column direction in a two-dimensional matrix, wherein each of the display elements includes a current-driven light emitting unit and a drive circuit for driving the light emitting unit, the drive circuit includes at least a drive transistor and a capacitor, and the drive transistor has a first source/drain region to which a drive voltage is applied via a first feeder line and a second source/drain region connected to a first end of the light emitting unit, and is configured in such a manner that a current corresponding to a voltage held in the capacitor flows to the light emitting unit via the drive transistor, the driving method including:
    setting a voltage of the second source/drain region of the drive transistor in such a manner that a difference between the voltage of the second source/drain region of the drive transistor and the drive voltage is decreased; and
    applying the drive voltage to the first source/drain region of the drive transistor thereafter, wherein
    a second end of the light emitting unit is connected to a second feeder line, and
    the voltage of the second source/drain region of the drive transistor is set when a voltage higher than a voltage during normal operation is supplied to the second feeder line.

* * * * *